(12) United States Patent
Fang et al.

(10) Patent No.: US 11,133,284 B2
(45) Date of Patent: Sep. 28, 2021

(54) SEMICONDUCTOR PACKAGE DEVICE

(71) Applicant: Advanced Semiconductor Engineering, Inc., Kaohsiung (TW)

(72) Inventors: Hsu-Nan Fang, Kaohsiung (TW); Jen-Hsien Wong, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/232,935

(22) Filed: Dec. 26, 2018

(65) Prior Publication Data
US 2020/0212005 A1 Jul. 2, 2020

(51) Int. Cl.
| | |
|---|---|
| H01L 25/065 | (2006.01) |
| H01L 23/498 | (2006.01) |
| H01L 23/31 | (2006.01) |
| H01L 21/48 | (2006.01) |
| H01L 21/56 | (2006.01) |
| H01L 25/00 | (2006.01) |

(52) U.S. Cl.
CPC ...... *H01L 25/0652* (2013.01); *H01L 21/4846* (2013.01); *H01L 21/563* (2013.01); *H01L 23/3107* (2013.01); *H01L 23/3135* (2013.01); *H01L 23/49811* (2013.01); *H01L 25/50* (2013.01); *H01L 2225/0651* (2013.01); *H01L 2225/06506* (2013.01); *H01L 2225/06562* (2013.01)

(58) Field of Classification Search
CPC . H01L 25/043; H01L 25/0657; H01L 25/074; H01L 25/0756; H01L 25/117; H01L 25/0652; H01L 25/071; H01L 25/112; H01L 2225/0651; H01L 2225/06506; H01L 2225/06562; H01L 21/563; H01L 21/50; H01L 21/4846
See application file for complete search history.

(56) References Cited

U.S. PATENT DOCUMENTS

| | | | |
|---|---|---|---|
| 6,376,904 | B1 | 4/2002 | Haba et al. |
| 7,687,921 | B2 | 3/2010 | Hiew et al. |
| 9,716,079 | B2 | 7/2017 | Chang et al. |
| 2013/0049221 | A1* | 2/2013 | Han ............ H01L 24/97 257/774 |
| 2017/0033084 | A1* | 2/2017 | Chang ............ H01L 21/78 |

* cited by examiner

*Primary Examiner* — Laura M Menz
*Assistant Examiner* — Candice Chan
(74) *Attorney, Agent, or Firm* — Foley & Lardner LLP

(57) ABSTRACT

A semiconductor package device includes a circuit layer, a first set of stacked components, a first conductive wire, a space and an electronic component. The first set of stacked components is disposed on the circuit layer. The first conductive wire electrically connects the first set of stacked components. The space is defined between the first set of stacked components and the circuit layer. The space accommodates the first conductive wire. The electronic component is disposed in the space.

22 Claims, 43 Drawing Sheets

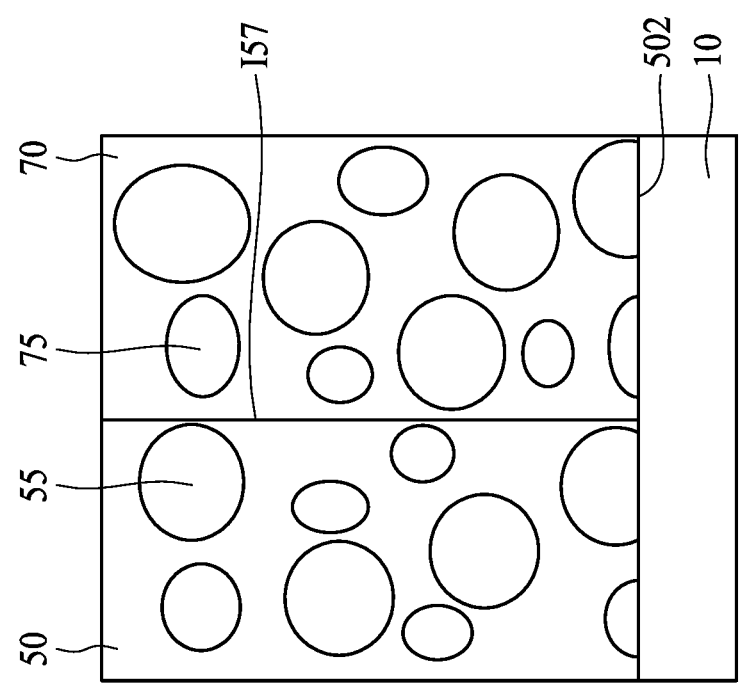

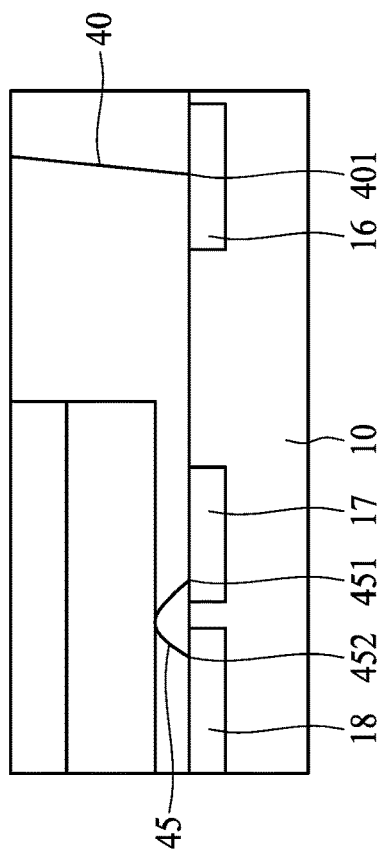
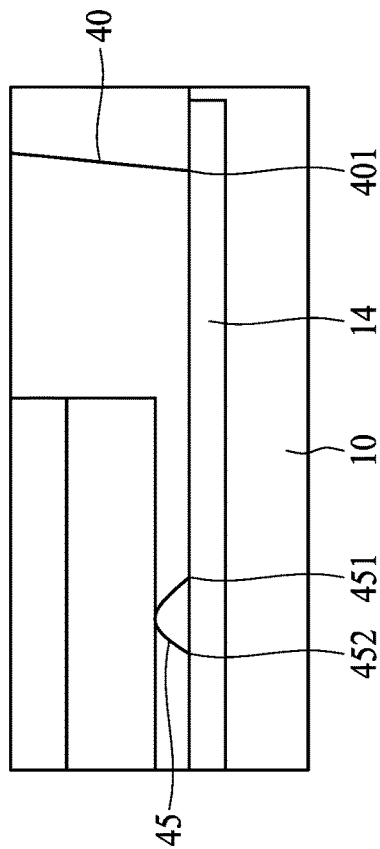

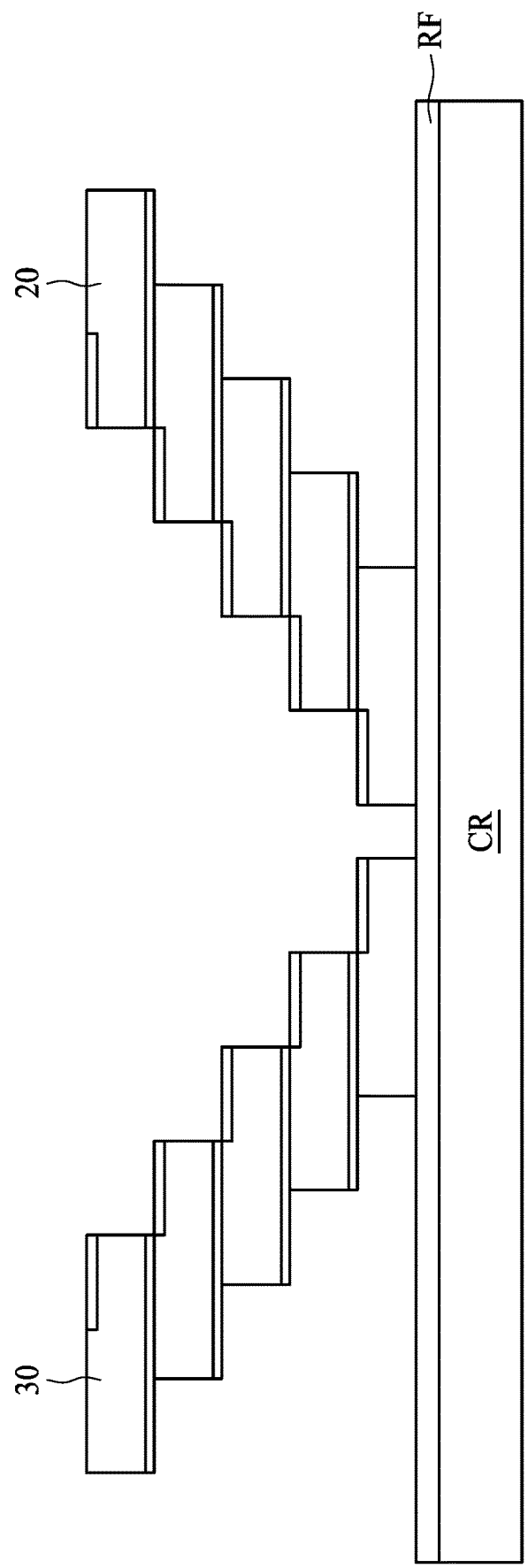

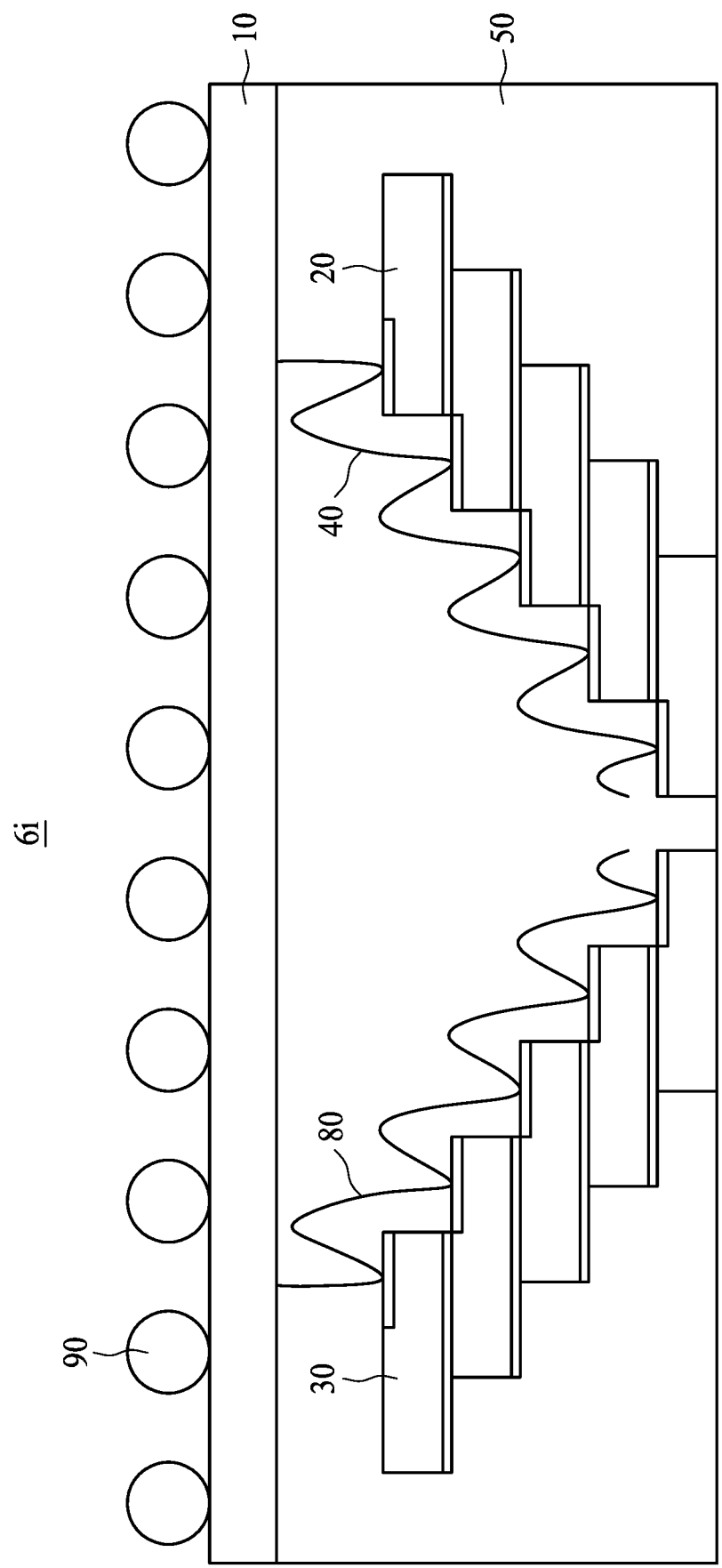

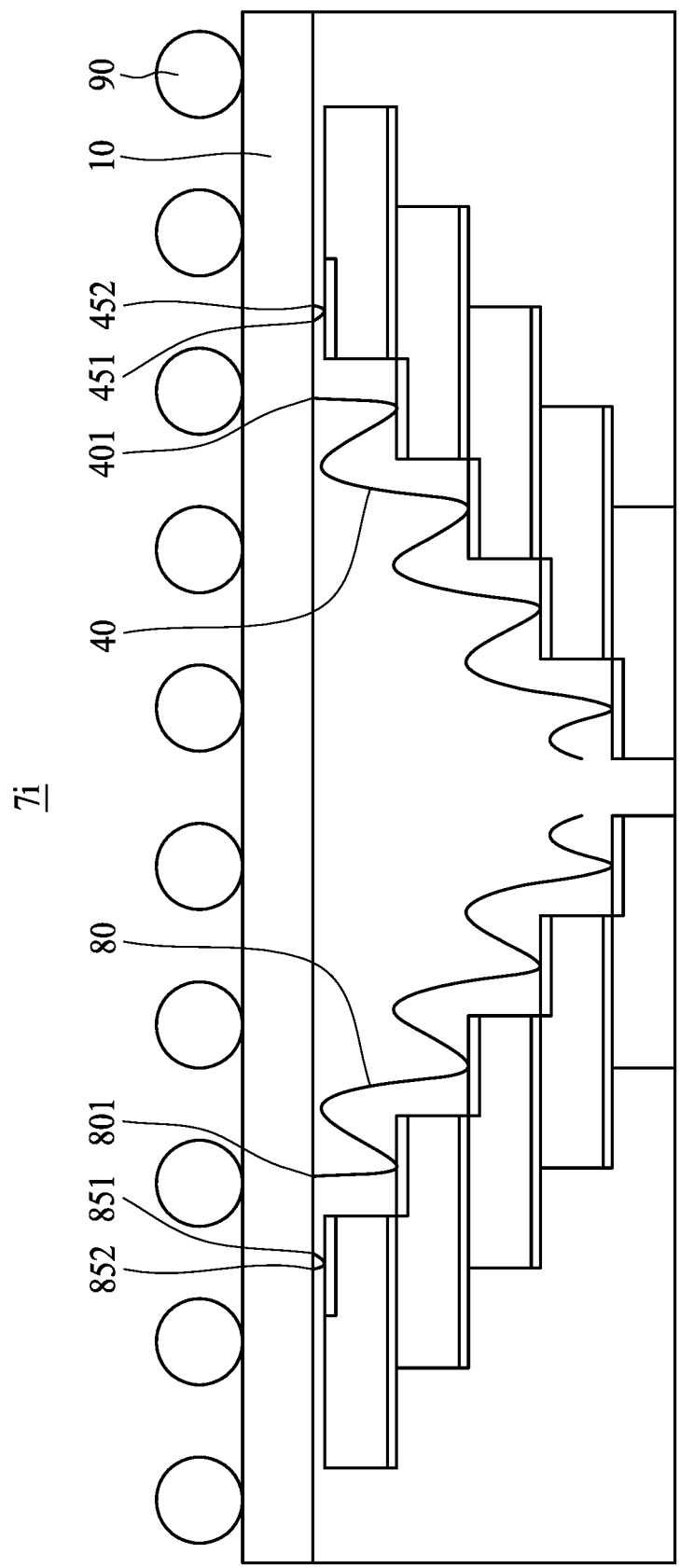

SEMICONDUCTOR PACKAGE DEVICE

BACKGROUND

1. Technical Field

The present disclosure relates generally to a semiconductor package device, and more particularly, the present disclosure relates to a semiconductor package device including stacked components and a method of manufacturing the same.

2. Description of the Related Art

When a logic integrated circuit (IC) such as a controller and a stack of memory dies are packaged into a semiconductor package, a side by side arrangement is often adopted, which may hinder the miniaturization of the semiconductor package. Further, spaces for accommodating the wires connecting the stack of memory dies and a substrate also hinder the miniaturization of the semiconductor package.

SUMMARY

In one aspect, according to some embodiments, a semiconductor package device includes a circuit layer, a first set of stacked components, a first conductive wire, a space and an electronic component. The first set of stacked components is disposed on the circuit layer. The first conductive wire electrically connects the first set of stacked components. The space is defined between the first set of stacked components and the circuit layer. The space accommodates the first conductive wire. The electronic component is disposed in the space.

In another aspect, according to some embodiments, a semiconductor package device includes a circuit layer, a first set of stacked chips, a first conductive wire, a second conductive wire, and a first insulating layer. The first set of stacked chips is disposed on the circuit layer. The first set of stacked chips includes a first chip and a second chip disposed on the first chip. The first conductive wire is electrically connected to the first chip. The second conductive wire is electrically connected to the second chip. The first insulating layer encapsulates the first set of stacked chips, a portion of the first conductive wire and a portion of the second conductive wire. The first conductive wire includes a terminal exposed from the first insulating layer and electrically connected to the circuit layer. The second conductive wire includes a first terminal exposed from the first insulating layer and electrically connected to the circuit layer.

In yet another aspect, according to some embodiments, a method of manufacturing a semiconductor package device includes providing a carrier with a first set of stacked components, bonding a first conductive wire on the first set of stacked components, forming a first insulating material to encapsulate the first set of stacked components and the first conductive wire, forming a recess in the first insulating material, and disposing an electronic component in the recess.

BRIEF DESCRIPTION OF THE DRAWINGS

Aspects of the present disclosure are best understood from the following detailed description when read with the accompanying drawings. It is noted that various features may not be drawn to scale, and, in the drawings, the dimensions of the depicted features may be arbitrarily increased or reduced for clarity of discussion.

FIG. 1B illustrates an enlarged view of a portion of the semiconductor package device in FIG. 1A.

FIG. 3B illustrates an enlarged view of a portion of the semiconductor package device in FIG. 3A.

FIG. 3C illustrates an enlarged view of a portion of the semiconductor package device in accordance with some embodiments of the present disclosure.

FIG. 6A, FIG. 6B, FIG. 6C, FIG. 6D, FIG. 6E, FIG. 6F, FIG. 6G, FIG. 6H and FIG. 6I are cross-sectional views of a semiconductor package device fabricated at various stages, in accordance with some embodiments of the present disclosure.

FIG. 7A, FIG. 7B, FIG. 7C, FIG. 7D, FIG. 7E, FIG. 7F, FIG. 7G, FIG. 7H and FIG. 7I are cross-sectional views of a semiconductor package device fabricated at various stages, in accordance with some embodiments of the present disclosure.

Common reference numerals are used throughout the drawings and the detailed description to indicate the same or similar elements. The present disclosure will be more readily understood from the following detailed description taken in conjunction with the accompanying drawings.

DETAILED DESCRIPTION

According to some embodiments of the present disclosure, by disposing an electronic component such as a logic IC in a space that is between a stack of memory dies and a substrate and accommodates wires connecting the memory dies to the substrate, the size of a semiconductor package can be reduced.

Figure 1A:
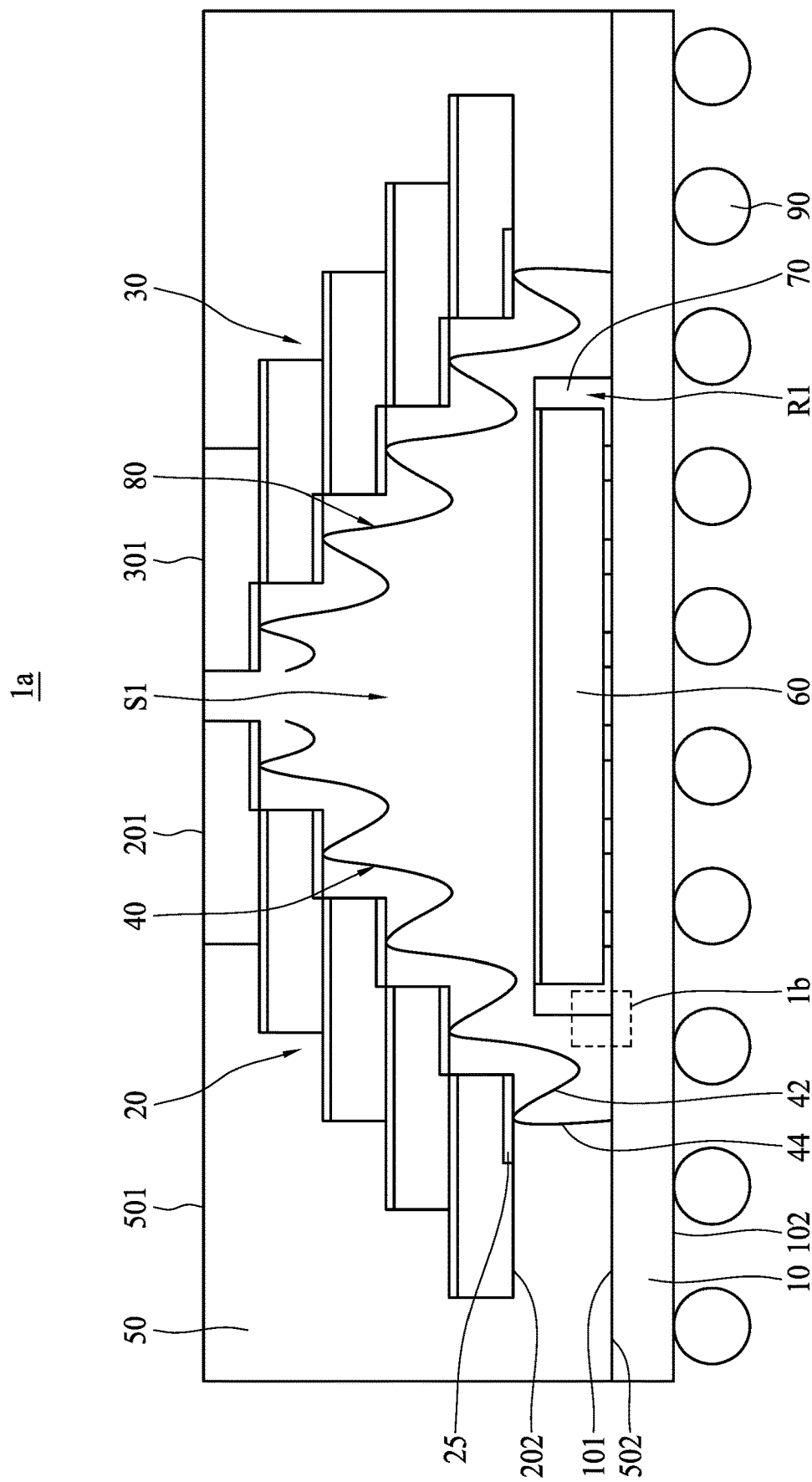
FIG. 1A illustrates a cross-sectional view of a semiconductor package device in accordance with some embodiments of the present disclosure.

FIG. 1A illustrates a cross-sectional view of a semiconductor package device 1a in accordance with some embodiments of the present disclosure.

The semiconductor package device 1a includes a circuit layer 10, a set of stacked components 20, a set of stacked components 30, a conductive wire 40, a conductive wire 80, an electronic component 60, an insulating layer 50, an insulating layer 70 and connection elements 90.

The circuit layer 10 may be a substrate. The circuit layer 10 may include, for example, a printed circuit board, such as a paper-based copper foil laminate, a composite copper foil laminate, or a polymer-impregnated glass-fiber-based copper foil laminate. The circuit layer 10 may include an interconnection structure, such as a redistribution layer (RDL) or a grounding element.

The set of stacked components 20 is disposed on the circuit layer 10. The set of stacked components 20 is disposed over or above the circuit layer 10. In the embodiment shown in FIG. 1A, the set of stacked components 20 is spaced apart from the circuit layer 10. In other embodiments, the set of stacked components 20 may be in contact with the circuit layer 10. The set of stacked components 20 includes a plurality of stacked components. In the embodiment shown in FIG. 1A, the components in the set of stacked components 20 are stacked in one direction (e.g., a direction substantially perpendicular to a surface 101 of the circuit layer 10) in the shape of a ladder. In other embodiments, the components in the set of stacked components 20 may be stacked in a different way. A space S1 is defined by or between the set of stacked components 20 and the circuit layer 10.

Each component in the set of stacked components 20 may be a chip or a die (such as a memory die) including a semiconductor substrate, one or more integrated circuit devices and one or more overlying interconnection structures therein. The integrated circuit devices may include active devices such as transistors and/or passive devices such resistors, capacitors, inductors, or a combination thereof.

The set of stacked components 30 is disposed on the circuit layer 10. The set of stacked components 30 is disposed over or above the circuit layer 10. In the embodiment shown in FIG. 1A, the set of stacked components 30 is spaced apart from the circuit layer 10. In other embodiments, the set of stacked components 30 may be in contact with the circuit layer 10. The set of stacked components 30 is disposed next to the set of stacked components 20. The set of stacked components 30 is spaced apart from the set of stacked components 20. The set of stacked components 30 includes a plurality of stacked components. In the embodiment shown in FIG. 1A, the components in the set of stacked components 30 are stacked in one direction (e.g., a direction substantially perpendicular to the surface 101 of the circuit layer 10) in the shape of a ladder. In other embodiments, the components in the set of stacked components 30 may be stacked in a different way. The space S1 is defined by or between the set of stacked components 20, the set of stacked components 30 and the circuit layer 10. The space S1 is surrounded or defined by the set of stacked components 20, the set of stacked components 30 and the circuit layer 10.

Each component in the set of stacked components 30 may be a chip or a die (such as a memory die) including a semiconductor substrate, one or more integrated circuit devices and one or more overlying interconnection structures therein. The integrated circuit devices may include active devices such as transistors and/or passive devices such resistors, capacitors, inductors, or a combination thereof.

The conductive wire 40 electrically connects the set of stacked components 20. For example, the conductive wire 40 electrically connects one of the set of stacked components 20 to an adjacent one of the set of stacked components 20. The conductive wire 40 is electrically connected to at least two components of the set of stacked components 20. The conductive wire 40 is disposed within the space S1. The conductive wire 40 is accommodated in the space S1. The conductive wire 40 is disposed between the set of stacked components 20 and the circuit layer 10. The conductive wire 40 is disposed between the set of stacked components 20 and the set of stacked components 30.

As shown in FIG. 1A, the conductive wire 40 includes a portion 42 electrically connecting to two components of the set of stacked components 20 and a portion 44 electrically connecting the set of stacked components 20 to the circuit layer 10. The portion 44 may be substantially perpendicular to a surface 202 of the set of stacked components 20 or to the surface 101 of the circuit layer 10. A pad 25 of one component of the set of stacked components 20 is in contact with the portion 42 of the conductive wire 40 and the portion 44 of the conductive wire 40.

The conductive wire 80 electrically connects the set of stacked components 30. The conductive wire 80 is electrically connected to at least two components of the set of stacked components 30. For example, the conductive wire 80 electrically connects one of the set of stacked components 30 to an adjacent one of the set of stacked components 30. The conductive wire 80 is disposed within the space S1. The conductive wire 80 is accommodated in the space S1. The conductive wire 80 is disposed between the set of stacked components 30 and the circuit layer 10. The conductive wire 80 is disposed between the set of stacked components 20 and the set of stacked components 30.

The insulating layer (or insulating material) 50 is disposed on the circuit layer 10. The insulating layer 50 encapsulates the set of stacked components 20, the set of stacked components 30, the conductive wire 40, the conductive wire 80 and electronic component 60. A surface 201 of one component of the set of stacked components 20 is exposed from the insulating layer 50. The surface 201 of the one component of the set of stacked components 20 is coplanar with a surface 501 of the insulating layer 50. A surface 301 of one component of the set of stacked components 30 is exposed from the insulating layer 50. The surface 301 of the one component of the set of stacked components 30 is coplanar with a surface 501 of the insulating layer 50. The configuration may enhance the heat dissipation performance for the semiconductor package device 1a.

The insulating layer 50 defines a recess R1 to accommodate the electronic component 60. The recess R1 is recessed from a surface 502 of the insulating layer 50. The recess R1 is within the space S1. The insulating layer 50 may include an epoxy resin having fillers, a molding compound (e.g., an epoxy molding compound or other molding compound), a polyimide, a phenolic compound or material, a material with a silicone dispersed therein, or a combination thereof.

The electronic component 60 is disposed or accommodated in the recess R1. The electronic component 60 is disposed in the space S1 that accommodates the conductive wire 40 and the conductive wire 80. The electronic component 60 is surrounded by the conductive wire 40, the conductive wire 80 and the circuit layer 10. By the configuration that the conductive wire 40, the conductive wire 80 and the electronic component 60 are disposed within the space S1 surrounded by the set of stacked components 20, the set of stacked components 30 and the circuit layer 10, the size of the semiconductor package device 1a can be reduced.

The electronic component 60 may be or may include a controller. The electronic component 60 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. The electronic component 60 may be electrically connected to the circuit layer 10. The electronic component 60 may be electrically connected to the set of stacked components 20 and/or the set of stacked components 30 through the RDL within the circuit layer 10 and the conductive wire 40 and/or the conductive wire 80.

The insulating layer (or insulating material) 70 is disposed in the recess R1. The insulating layer 70 fills the recess R1. The insulating layer 70 is surrounded or encapsulated by the insulating layer 50. The insulating layer 70 is in contact with the insulating layer 50. The insulating layer 70 surrounds the electronic component 60. The insulating layer 70 is disposed between the electronic component 60 and the insulating layer 50. The insulating layer 70 may include an epoxy resin having fillers, a molding compound (e.g., an epoxy molding compound or other molding compound), a polyimide, a phenolic compound or material, a material with a silicone dispersed therein, or a combination thereof. The insulating layer 70 may have the same material as the insulating layer 50. The insulating layer 70 may have a different material from the insulating layer 50.

In some embodiments, an Young's modulus of the insulating layer 70 is different from an Young's modulus of the insulating layer 50. For example, the Young's modulus of the insulating layer 70 is greater than the Young's modulus of the insulating layer 50. In some embodiments, a coefficient of expansion (CTE) of the insulating layer 70 is greater than a CTE of the insulating layer 50. The modulus or CTE configuration may reduce or prevent package warpage for the semiconductor package device 1a.

The connection elements 90 are disposed on a surface 102 of the circuit layer 10. The connection elements 90 are electrically connected to conductive lines, traces, vias or pillars in the circuit layer 10. The connection elements 90 may include solder balls.

FIG. 1B illustrates an enlarged view of a portion 1b of the semiconductor package device 1a in FIG. 1A. The insulating layer 50 has a plurality of fillers 55. The insulating layer 70 has a plurality of fillers 75. An interface 157 is formed or defined between the insulating layer 50 and the insulating layer 70. As shown in FIG. 1B, the fillers 55 of the insulating layer 50 and the fillers 75 of the insulating layer 70 are separated clearly by the interface 157. No fillers (e.g., fillers 55 or 57) are crossed or intersected by the interface 157. In the vicinity of an interface 502 (which is also a surface of the encapsulant 50) between the encapsulant 50 and the circuit layer 10, some fillers 55 and 75 are intersected by the interface 502 and have a surface coplanar with the interface 502.

Figure 2A:
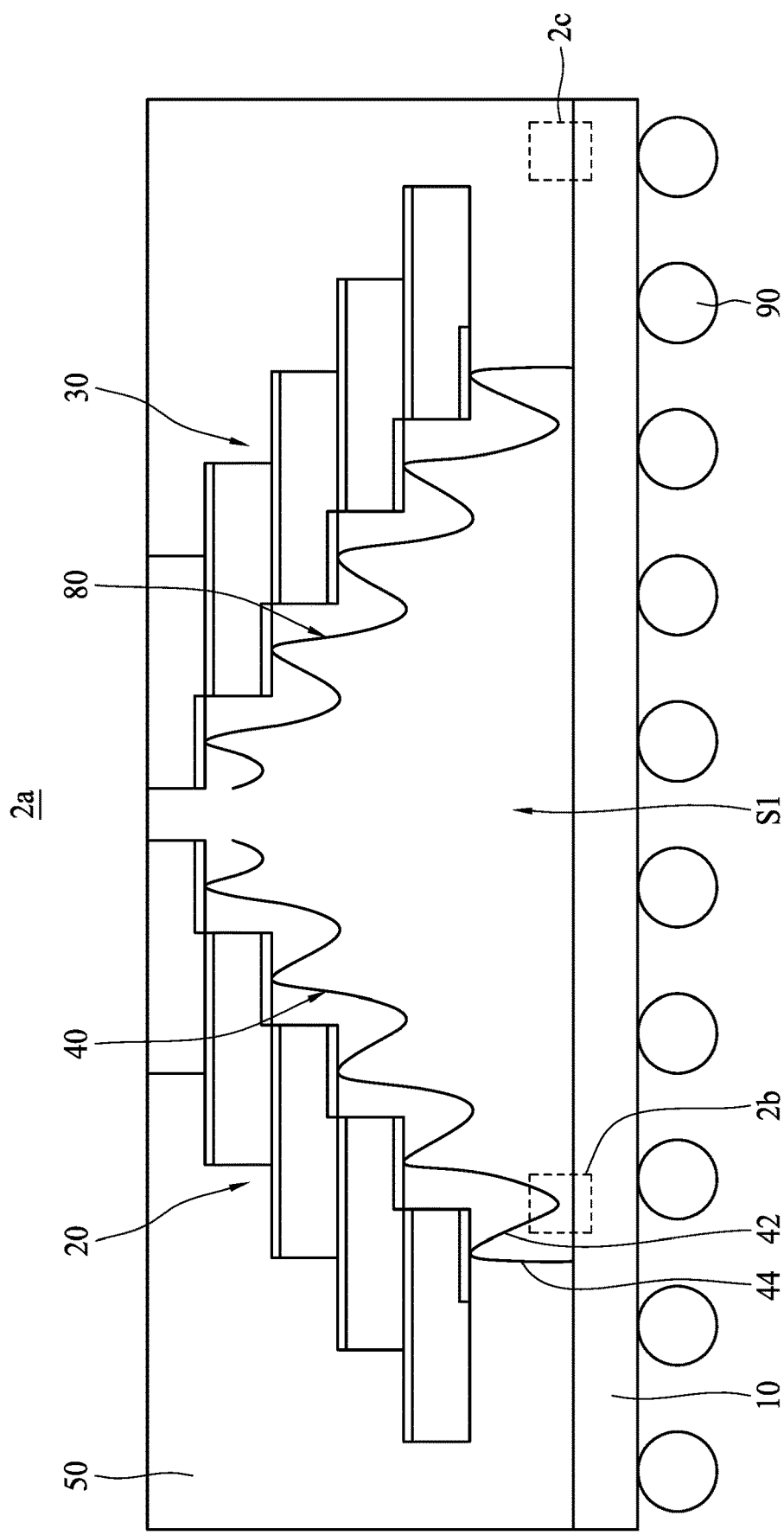
FIG. 2A illustrates a cross-sectional view of a semiconductor package device in accordance with some embodiments of the present disclosure.

FIG. 2A illustrates a cross-sectional view of a semiconductor package device 2a in accordance with some embodiments of the present disclosure. FIG. 2B illustrates an enlarged view of a portion 2b of the semiconductor package device 2a in FIG. 2A. The semiconductor package device 2a is similar to the semiconductor package device 1a in FIG. 1A with some differences described below.

The electronic component 60 in the semiconductor package device 1a in FIG. 1A is omitted. As shown in FIG. 2B, a distance D1 between the portion 42 of the conductive wire 40 and the circuit layer 10 is equal to or less than 50 μm. The configuration may achieve a more compact semiconductor package device.

Figure 2C:
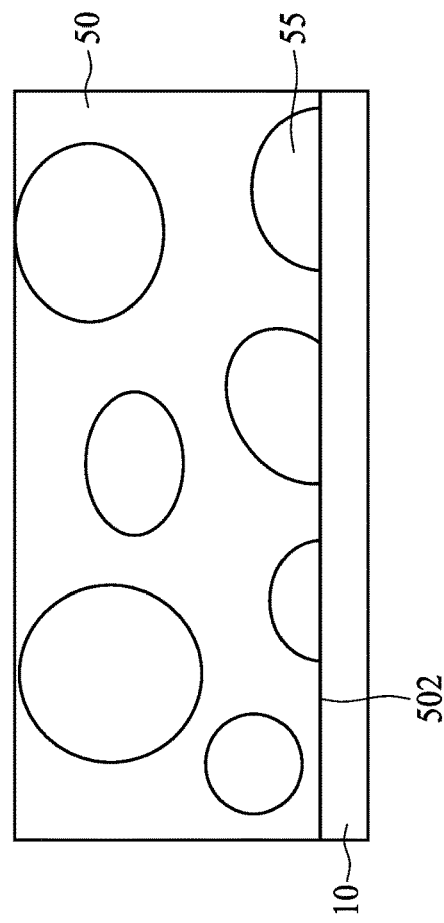
FIG. 2C illustrates an enlarged view of a portion of the semiconductor package device in FIG. 2A.
Figure 2B:
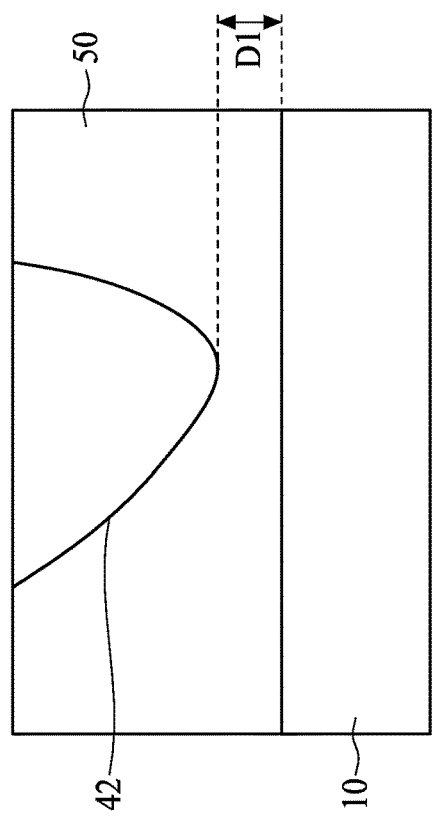
FIG. 2B illustrates an enlarged view of a portion of the semiconductor package device in FIG. 2A.

FIG. 2C illustrates an enlarged view of a portion 2c of the semiconductor package device 2a in FIG. 2A. As shown in FIG. 2C, the encapsulant 50 includes fillers 55. In the vicinity of an interface 502 (which is also a surface of the encapsulant 50) between the encapsulant 50 and the circuit layer 10, some fillers 55 are intersected by the interface 502 and have a surface coplanar with the interface 502.

Figure 3A:
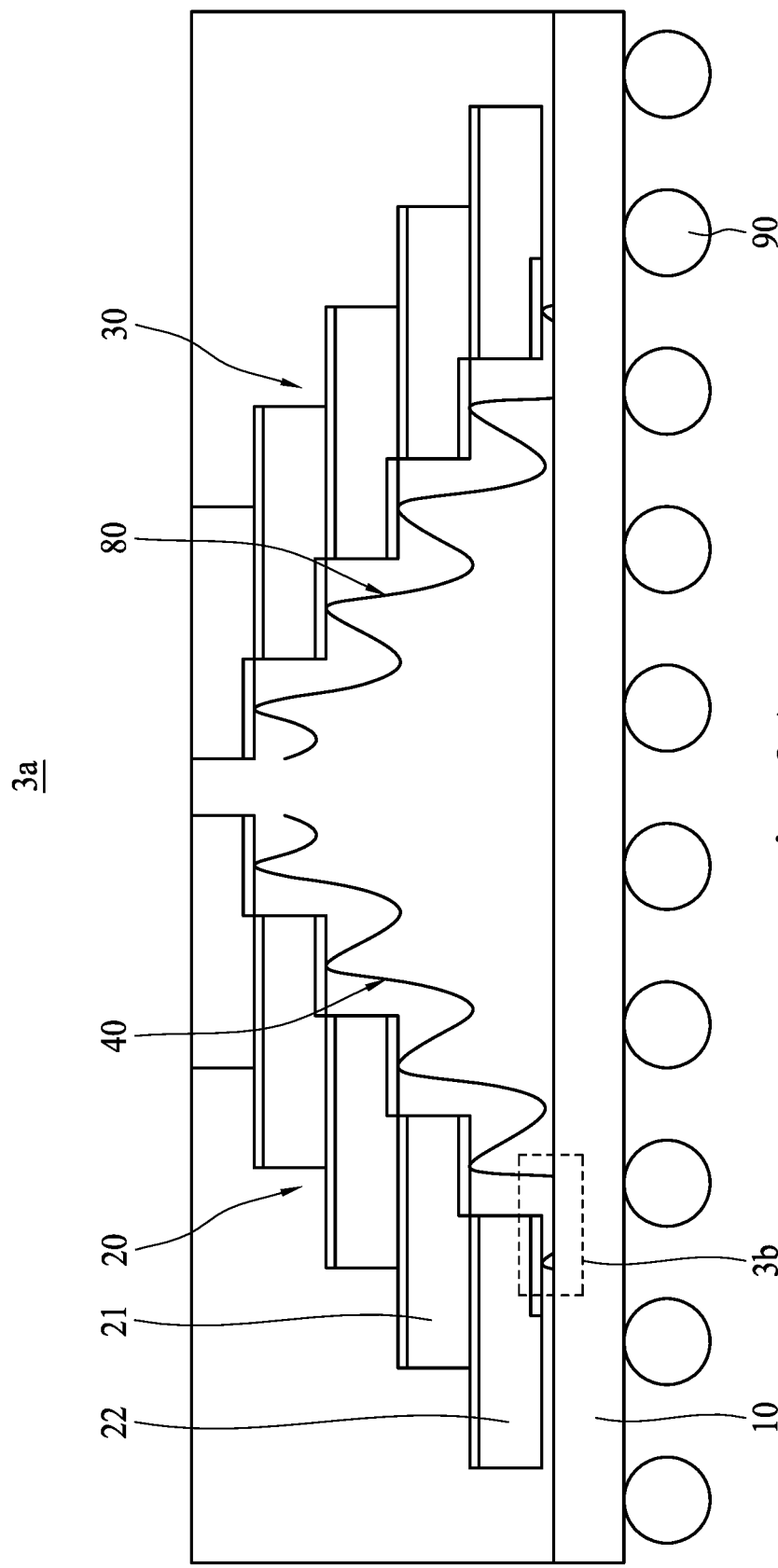
FIG. 3A illustrates a cross-sectional view of a semiconductor package device in accordance with some embodiments of the present disclosure.

FIG. 3A illustrates a cross-sectional view of a semiconductor package device 3a in accordance with some embodiments of the present disclosure. FIG. 3B illustrates an enlarged view of a portion 3b of the semiconductor package device 3a in FIG. 3A. The semiconductor package device 3a is similar to the semiconductor package device 2a in FIG. 2A with some differences described below.

Referring to FIG. 3A and FIG. 3B, the set of stacked components 20 includes a component 21 and a component 22 disposed or stacked on the component 21. The conductive wire 40 is electrically connected to the component 21. A conductive wire 45 is electrically connected to the component 22. The conductive wire 45 is separated from the conductive wire 40. The insulating layer 50 encapsulates the set of stacked components 20, a portion of the conductive wire 40 and a portion of the conductive wire 45. The conductive wire 40 includes a terminal or an end 401 exposed from the insulating layer 50 and electrically connected to the circuit layer 10. The conductive wire 45 includes terminals or ends 451 and 452 exposed from the insulating layer 50 and electrically connected to the circuit layer 10. In some embodiments, solely one of the terminals 451 and 452 is exposed from the insulating layer 50 and electrically connected to a pad (e.g., the pad 14 in FIG. 3B or the pad 16, 17, or 18 in FIG. 3C) of the circuit layer 10.

In the embodiment shown in FIG. 3B, the circuit layer 10 includes a pad 14 in contact with the terminal 401 of the conductive wire 40 and the terminals 451 and 452 of the conductive wire 45. For example, the pad 14 may be a common pad for the terminal 401 of the conductive wire 40 and the terminals 451 and 452 of the conductive wire 45. In another embodiment shown in FIG. 3C, the circuit layer 10 includes pads 16, 17 and 18. The pads 16, 17 and 18 are physically spaced apart from each other. Any two or three of the pads 16, 17 and 18 may be electrically connected to each other. The pad 16 is in contact with the terminal 401 of the conductive wire 40. The pad 17 is in contact with the terminal 451 of the conductive wire 45. The pad 18 is in contact with the terminal 452 of the conductive wire 45. In some embodiments, the configuration of two terminals 451 and 452 of the conductive wire 45 may ensure an electrical connection between the component 22 and the circuit layer 10. For example, the alignment between a pad of the circuit layer 10 and the conductive wire 45 may be facilitated.

Figure 4:
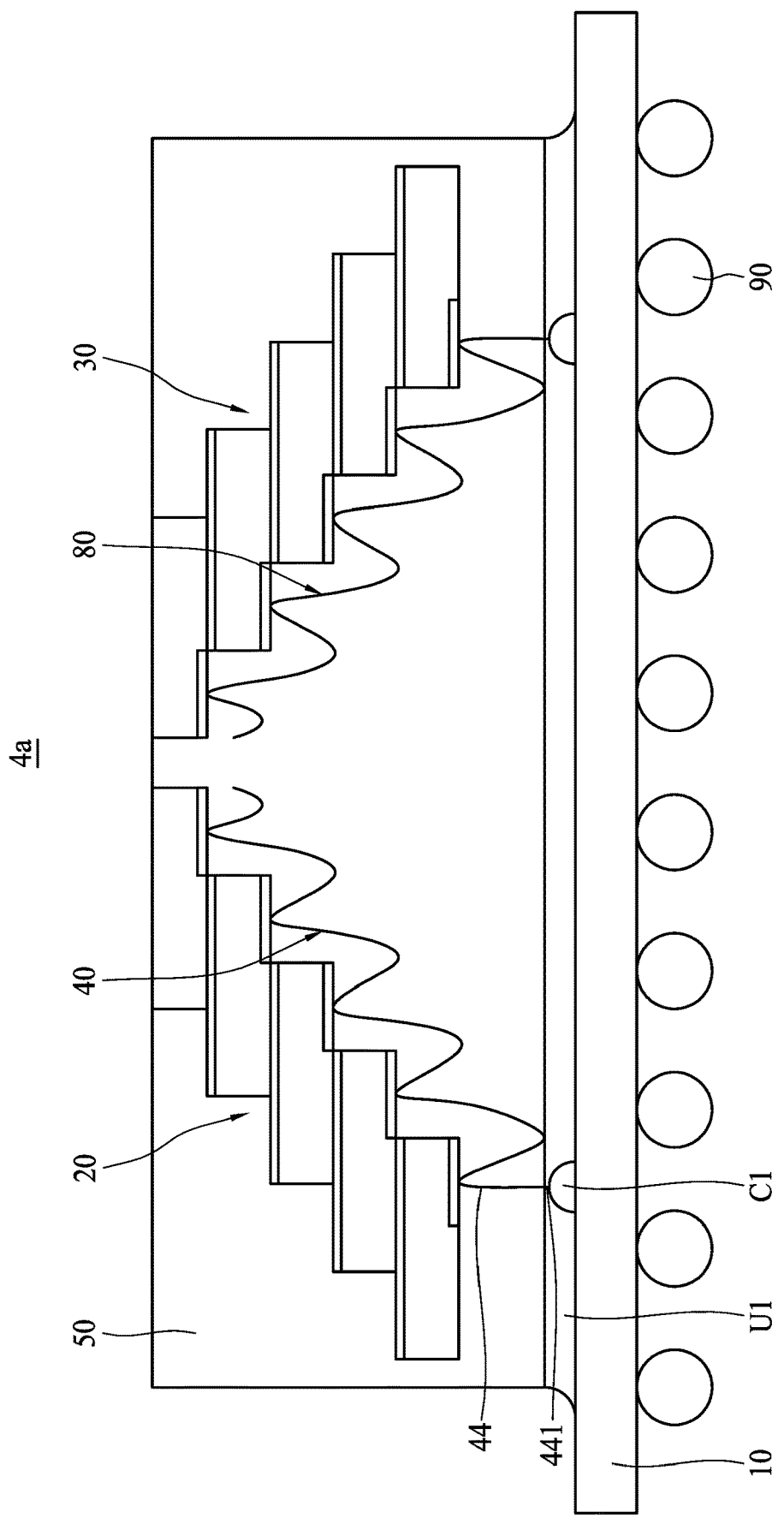
FIG. 4 illustrates a cross-sectional view of a semiconductor package device in accordance with some embodiments of the present disclosure.

FIG. 4 illustrates a cross-sectional view of a semiconductor package device 4a in accordance with some embodiments of the present disclosure. The semiconductor package device 4a is similar to the semiconductor package device 2a in FIG. 2A with some differences described below.

The portion 44 of the conductive wire 40 includes a terminal or an end 441 exposed from the insulating layer 50. An electrical contact C1 connects the terminal 441 of the conductive wire 40 to the circuit layer 10. An underfill U1 is disposed between the insulating layer 50 and the circuit layer 10. The underfill U1 surrounds or encapsulates the electrical contact C1. The electrical contact C1 may include solder. The configuration may enhance the connection between the conductive wire 40 and the circuit layer 10.

FIG. 5A, FIG. 5B, FIG. 5C, FIG. 5D, FIG. 5E, FIG. 5F, FIG. 5G, FIG. 5H, FIG. 5I, FIG. 5J and FIG. 5K are cross-sectional views of a semiconductor package device 5k fabricated at various stages, in accordance with some embodiments of the present disclosure. Various figures have been simplified for a better understanding of the aspects of the present disclosure.

Figure 5A:
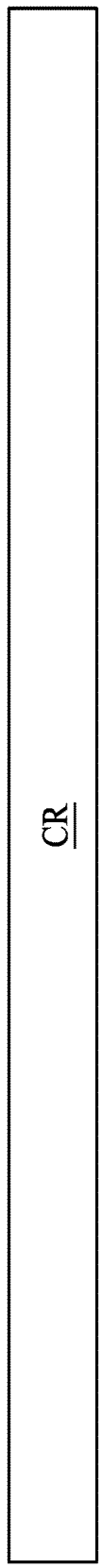
FIG. 5A, FIG. 5B, FIG. 5C, FIG. 5D, FIG. 5E, FIG. 5F, FIG. 5G, FIG. 5H, FIG. 5I, FIG. 5J and FIG. 5K are cross-sectional views of a semiconductor package device fabricated at various stages, in accordance with some embodiments of the present disclosure.
Figure 5B:
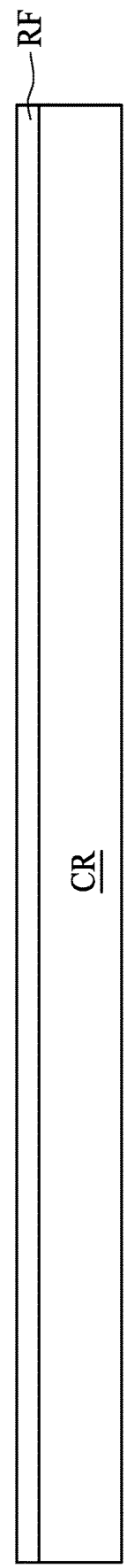
Figure 5C:
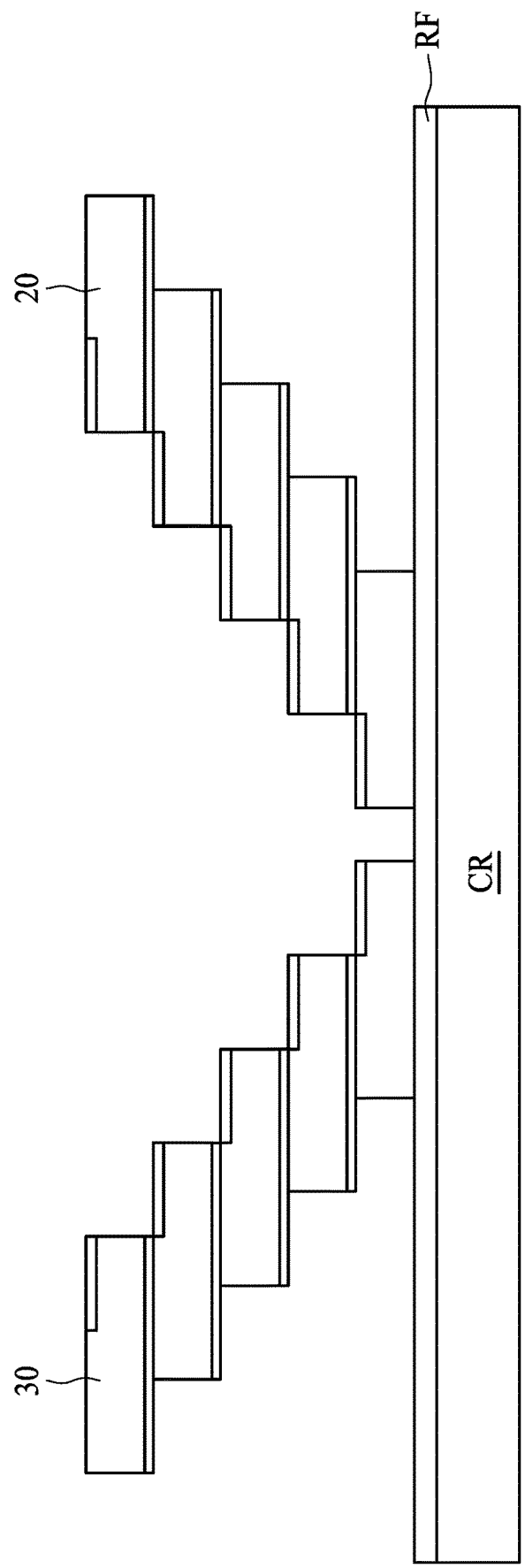
Figure 5D:
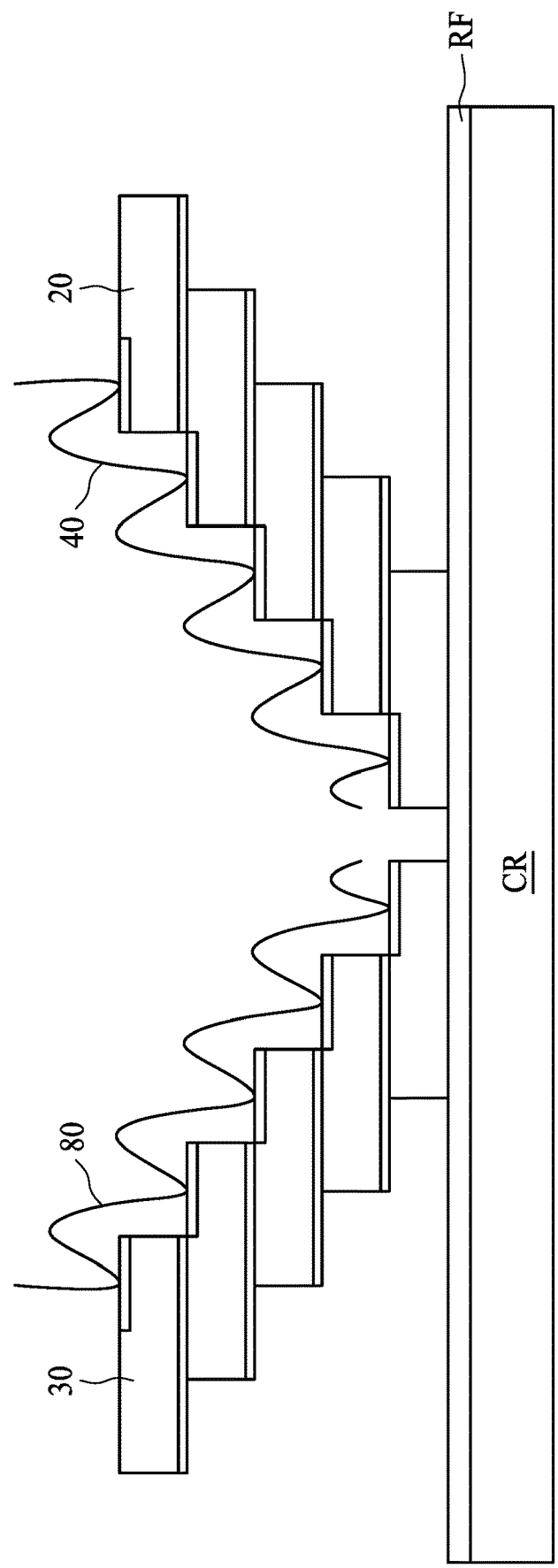

Referring to FIG. 5A, a carrier CR is provided. The carrier CR may include glass or other materials. Referring to FIG. 5B, a release film or a release layer RF is provided on the carrier CR. The release film RF may be coated or laminated on the carrier CR. Referring to FIG. 5C, sets of stacked components 20 and 30 are disposed on the release film RF, wherein die bonding operations may be performed. Referring to FIG. 5D, a conductive wire 40 is bonded on the set of stacked components 20. A conductive wire 80 is bonded on the set of stacked components 30. A vertical bonding operation may be utilized in bonding the conductive wires 40 and 80.

Figure 5E:
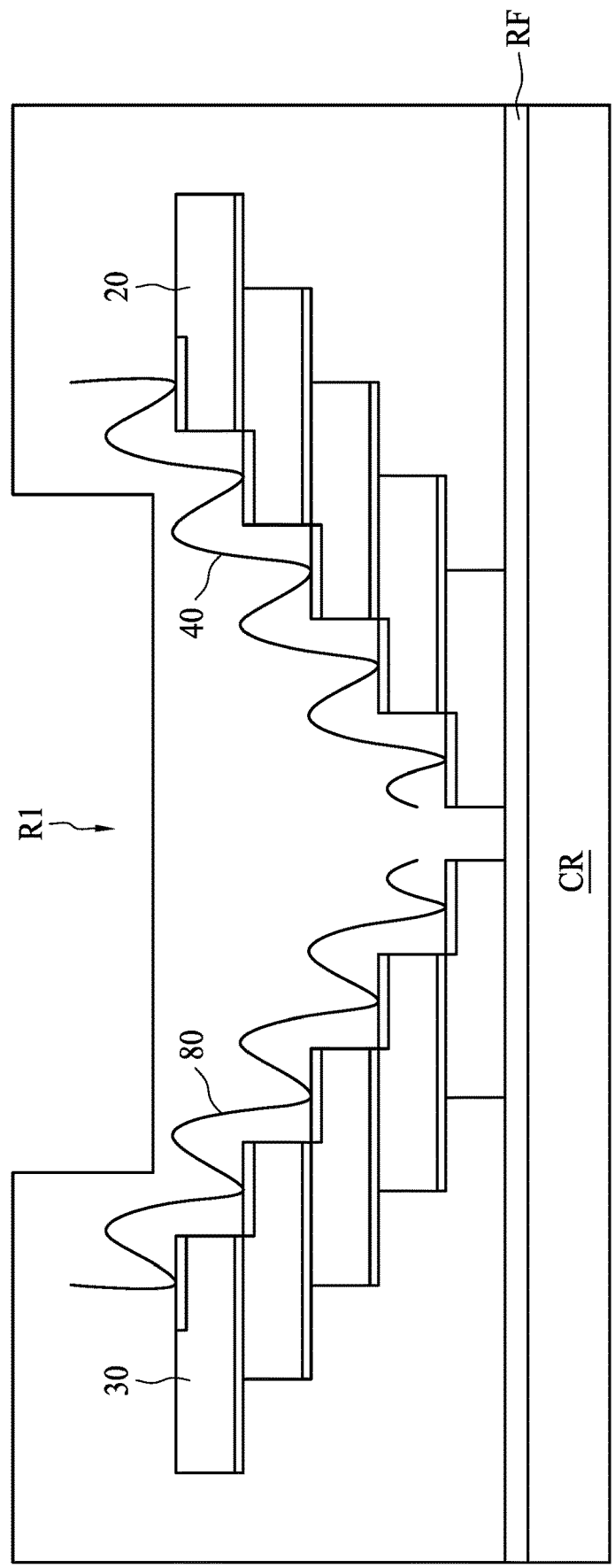
Figure 5F:
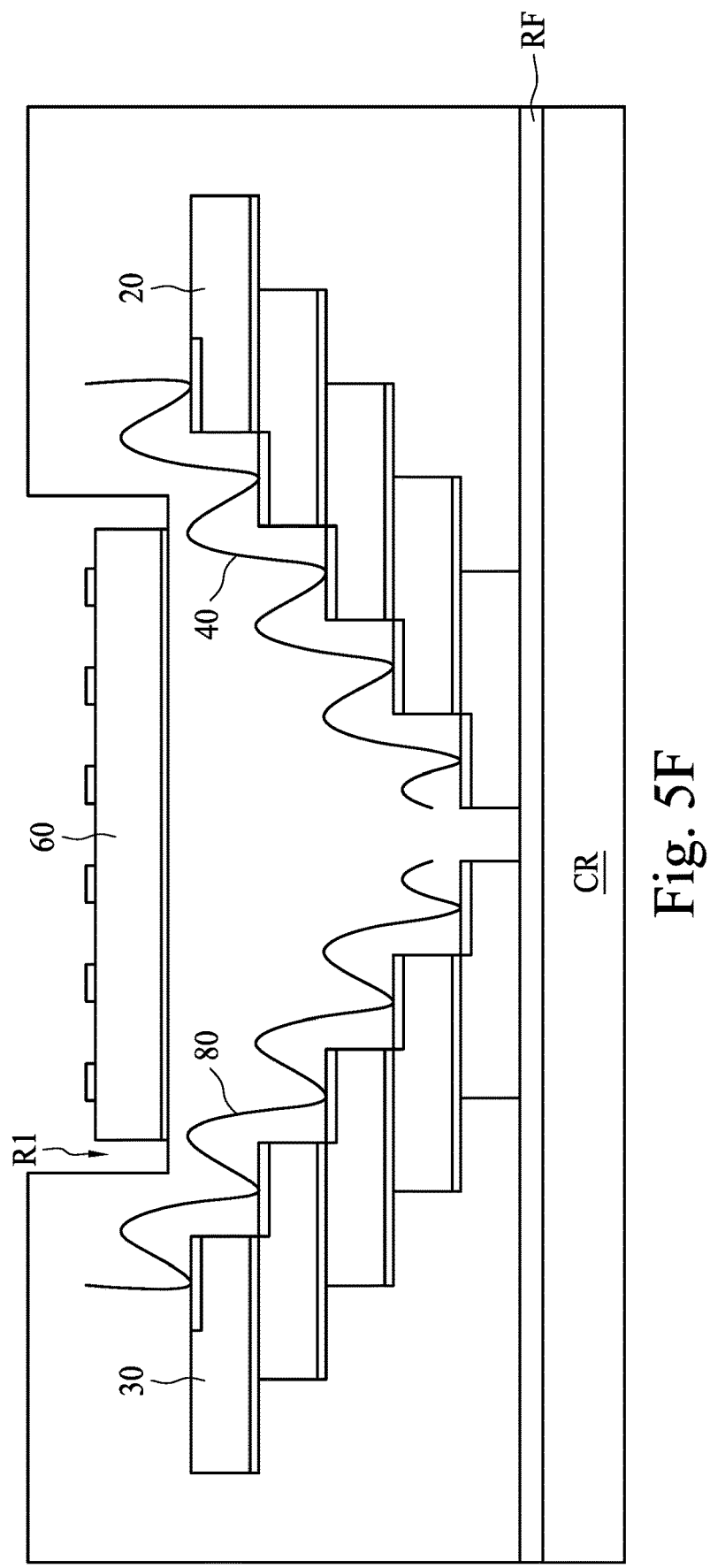

Referring to FIG. 5E, an insulating layer (or insulating material) 50 is formed on the release film RF. The insulating layer 50 encapsulates the set of stacked components 20, the set of stacked components 30, the conductive wire 40 and the conductive wire 80. The insulating layer 50 may be formed by a molding operation. A recess R1 is formed on a surface of the insulating layer 50 and is recessed into the insulating layer 50. The recess R1 may be formed by operations such as a drilling operation, an etching operation or a laser operation. Referring to FIG. 5F, an electronic component 60 is disposed in the recess R1.

Figure 5G:
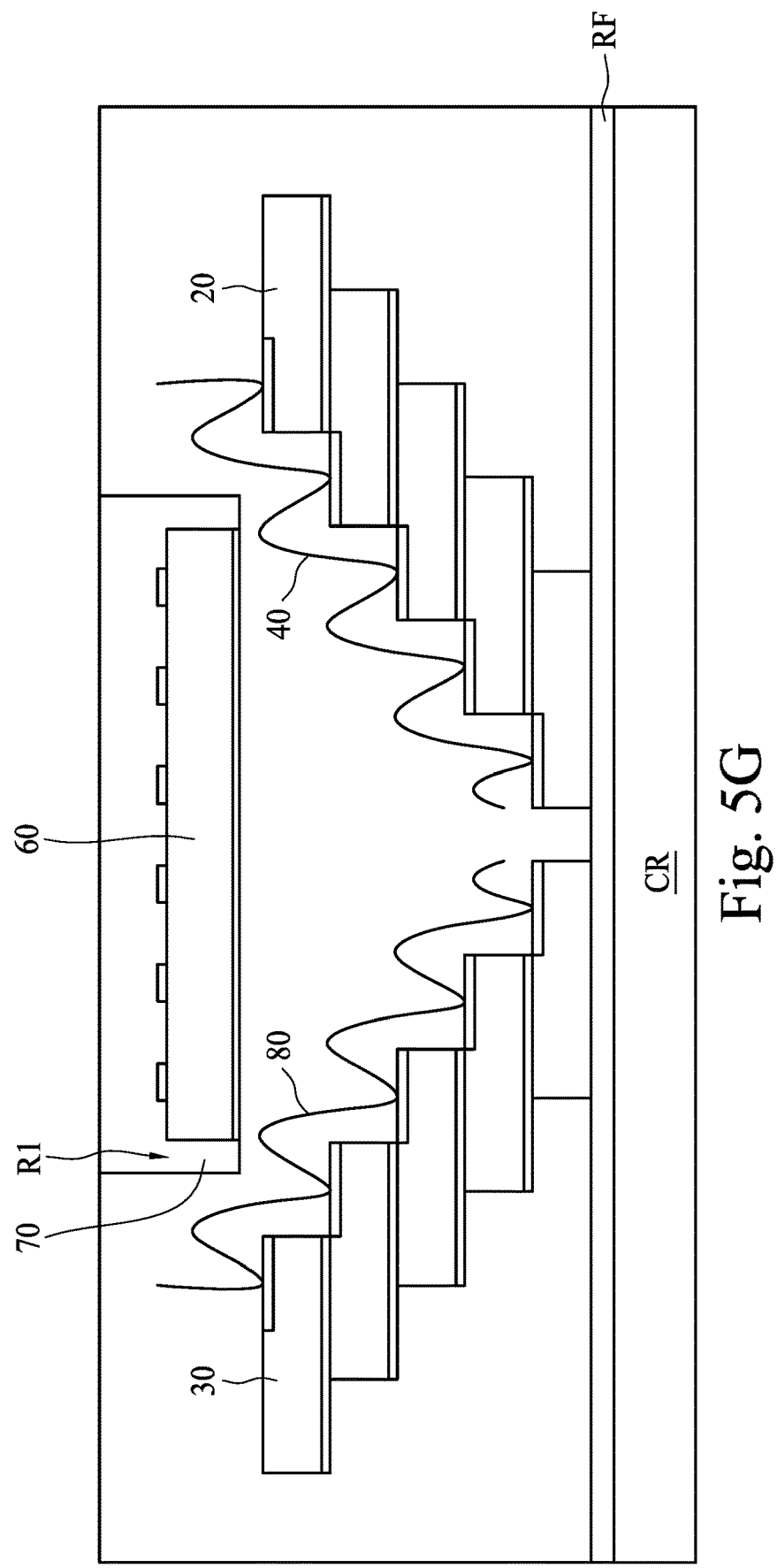
Figure 5H:
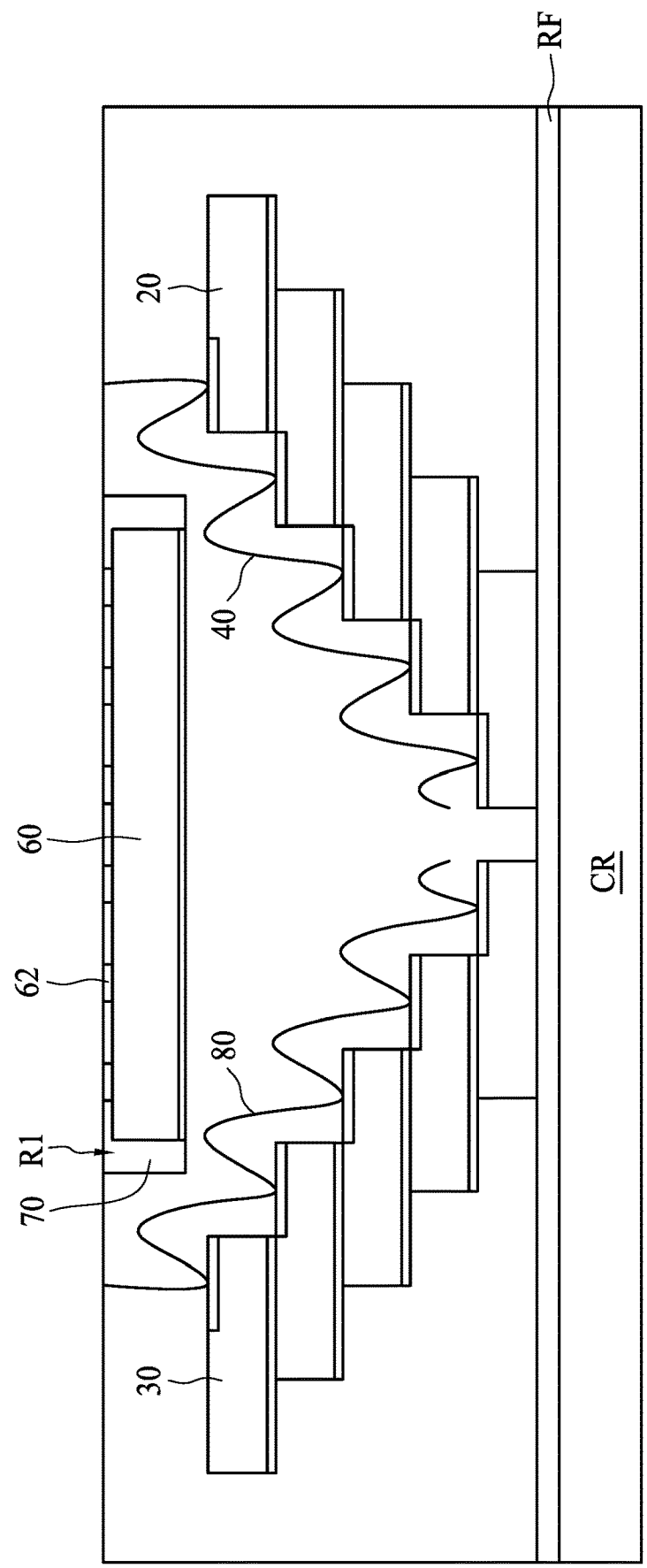
Figure 5I:
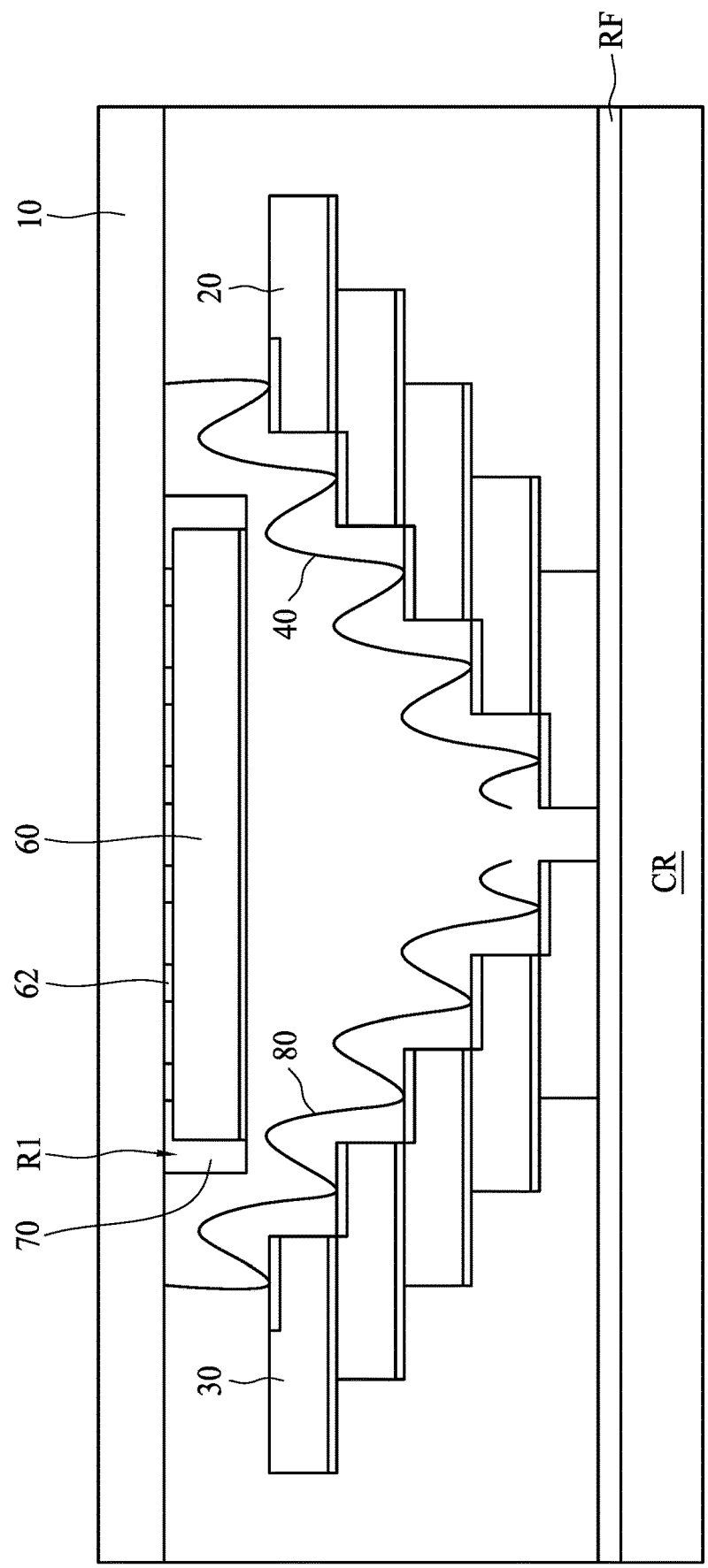

Referring to FIG. 5G, an insulating layer (or insulating material) 70 is filled into the recess R1 to surround the electronic component 60. The insulating layer 70 may be formed by a molding operation or a dispensing operation. Referring to FIG. 5H, a grinding operation is performed to remove a portion of the insulating layer 50 and a portion of the insulating layer 70 to expose the conductive wire 40, the conductive wire 80 and electrical contacts 62 of the electronic component 60. Referring to FIG. 5I, a circuit layer (or redistribution layer) 10 is formed on the insulating layer 50, the insulating layer 70 and the electronic component 60. The circuit layer 10 is electrically connected to the conductive wire 40, the conductive wire 80 and the electronic component 60.

Figure 5J:
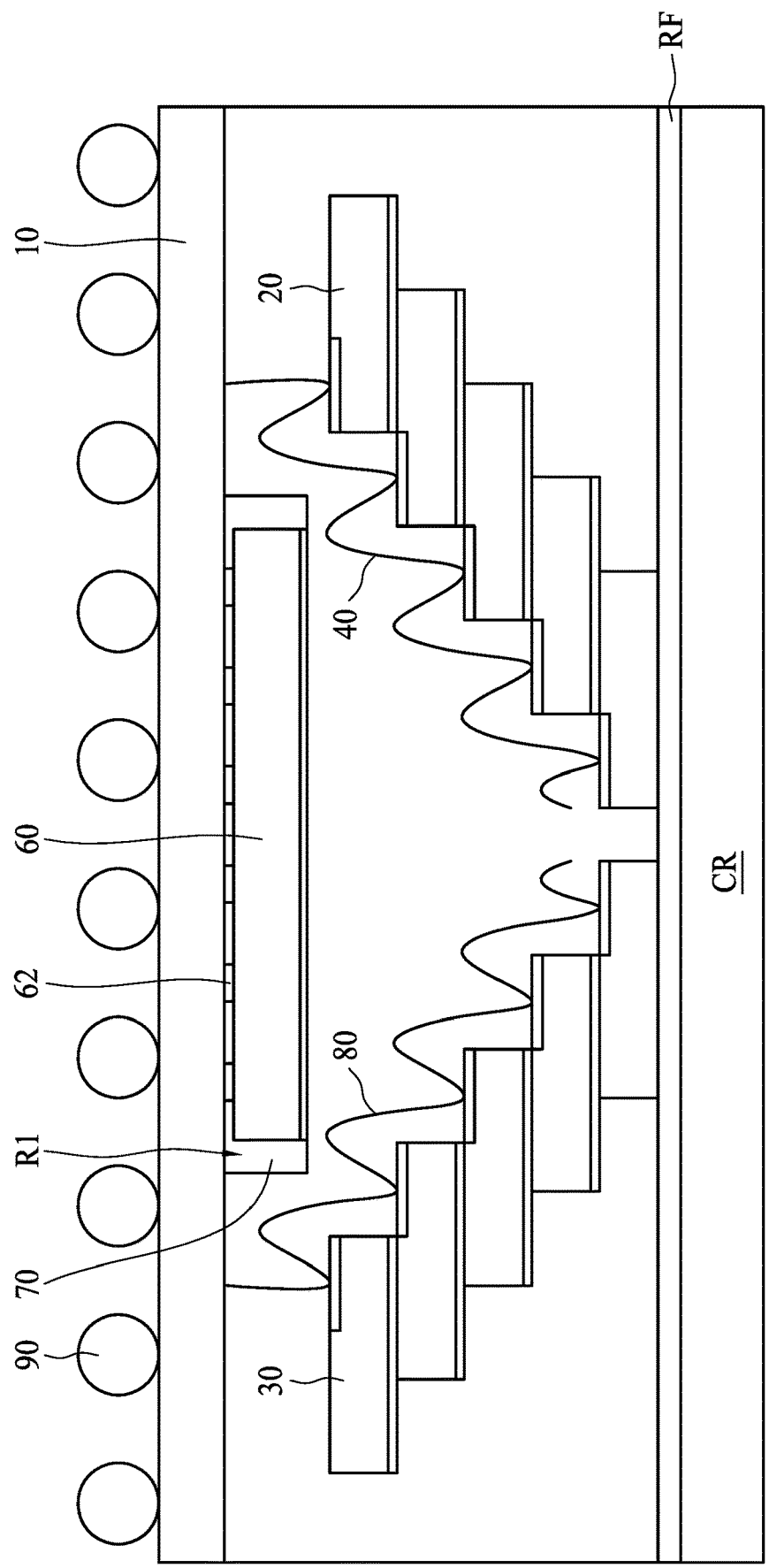
Figure 5K:
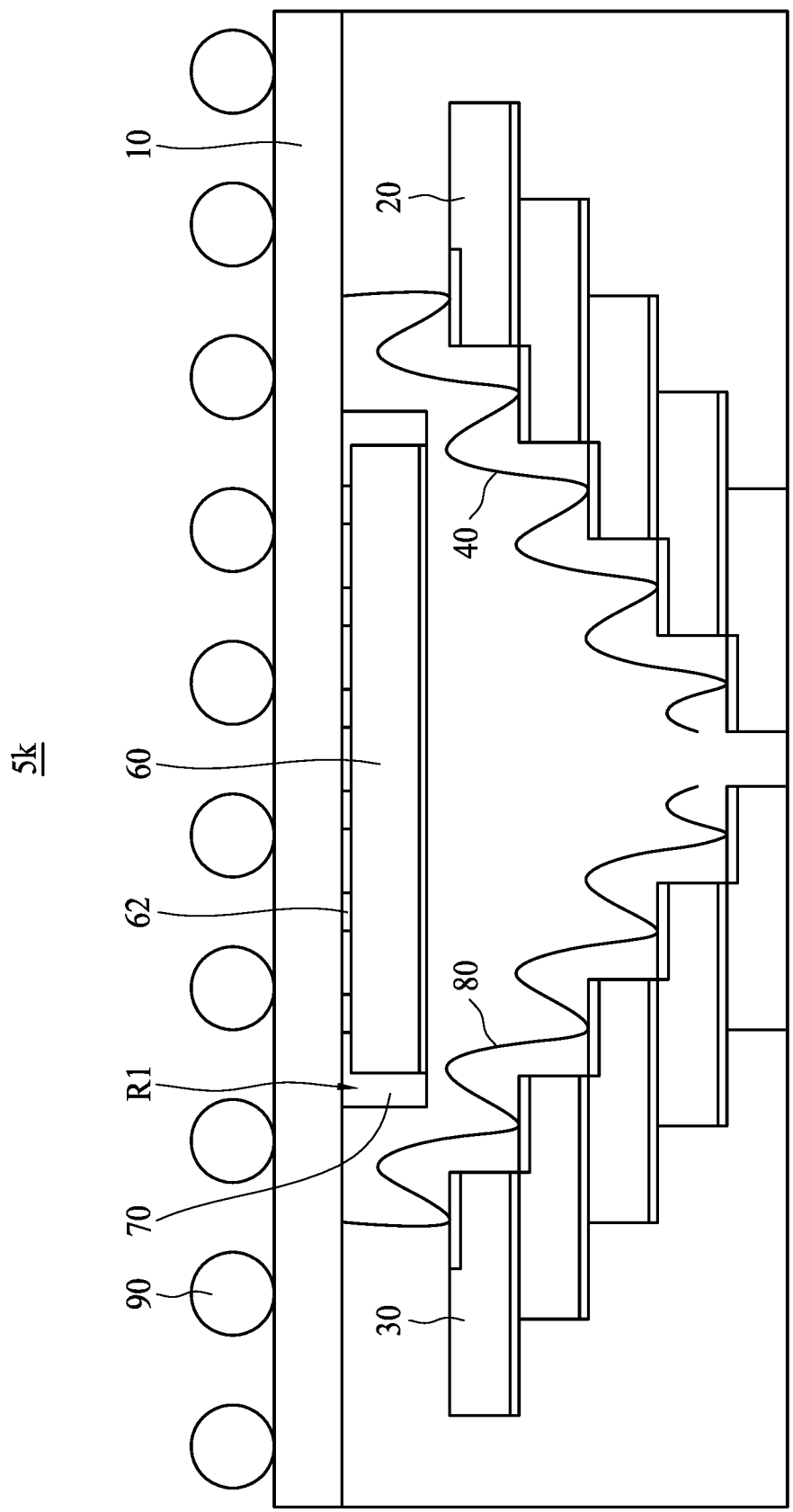

Referring to FIG. 5J, connection elements 90 are disposed on the circuit layer 10. The connection elements 90 are electrically connected to conductive lines, traces, vias or pillars in the circuit layer 10. The connection elements 90 may be disposed by a ball mount operation which may include a reflow operation. Referring to FIG. 5K, the carrier CR and the release film RF are removed. An ultraviolet operation may be used to remove the carrier CR and the release film RF. The set of stacked components 20 and the set of stacked components 30 are exposed. The semiconductor package device 5k is formed. The semiconductor package device 5k may be similar to or the same as the semiconductor package device 1a of FIG. 1A.

FIG. 6A, FIG. 6B, FIG. 6C, FIG. 6D, FIG. 6E, FIG. 6F, FIG. 6G, FIG. 6H and FIG. 6I are cross-sectional views of a semiconductor package device 6i fabricated at various stages, in accordance with some embodiments of the present disclosure. Various figures have been simplified for a better understanding of the aspects of the present disclosure.

Figure 6A:
Figure 6B:
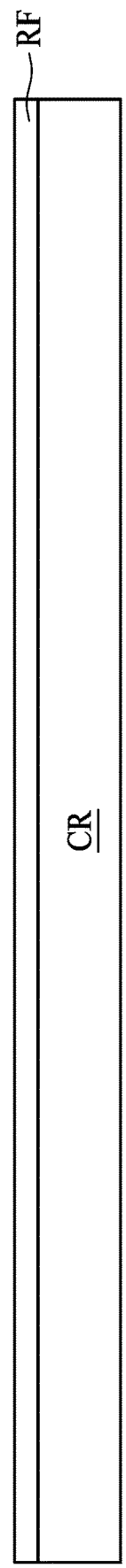
Figure 6D:
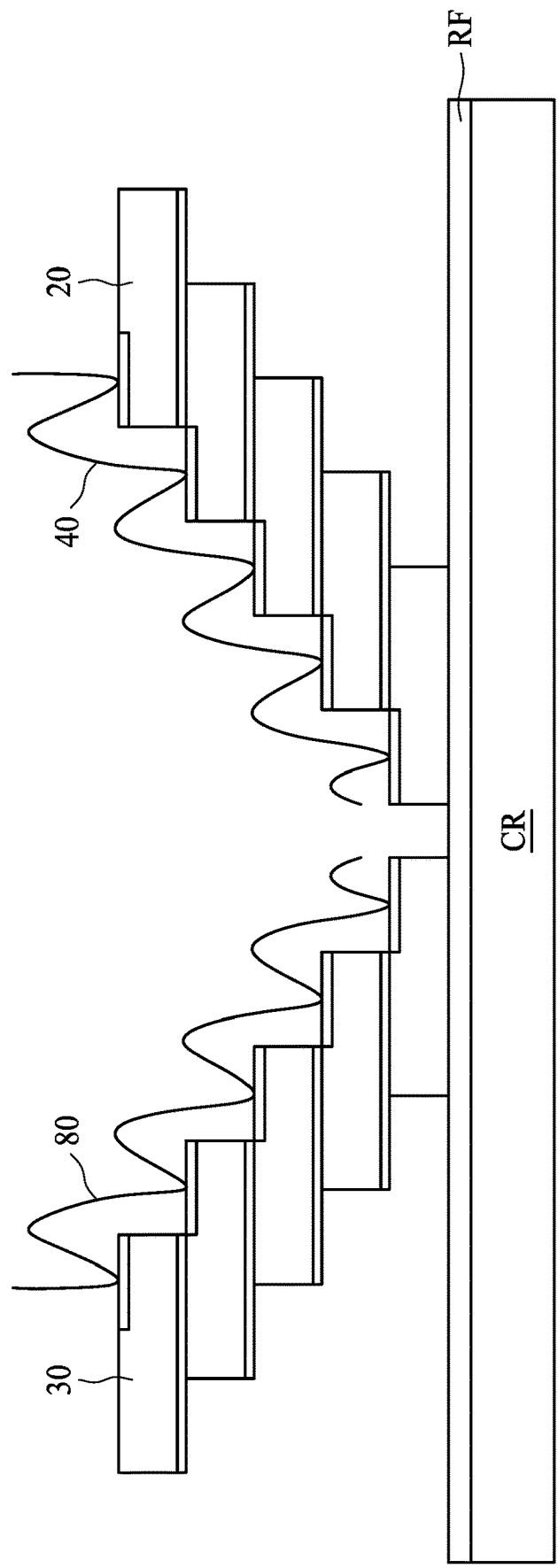

Referring to FIG. 6A, a carrier CR is provided. The carrier CR may include glass or other materials. Referring to FIG. 6B, a release film or a release layer RF is provided on the carrier CR. The release film RF may be coated or laminated on the carrier CR. Referring to FIG. 6C, sets of stacked components 20 and 30 are disposed on the release film RF, wherein die bonding operations may be performed. Referring to FIG. 6D, a conductive wire 40 is bonded on the set of stacked components 20. A conductive wire 80 is bonded on the set of stacked components 30. A vertical bonding operation may be utilized in bonding the conductive wires 40 and 80.

Figure 6E:
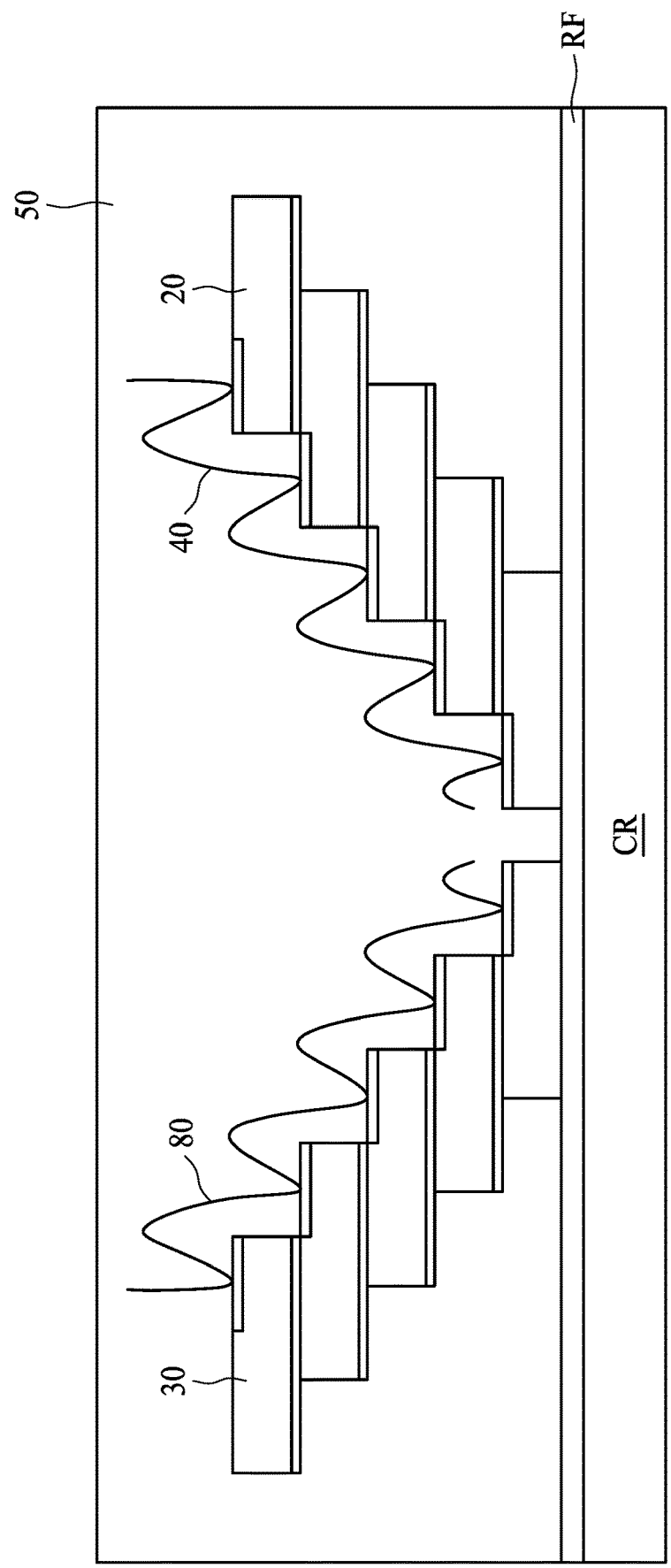
Figure 6F:
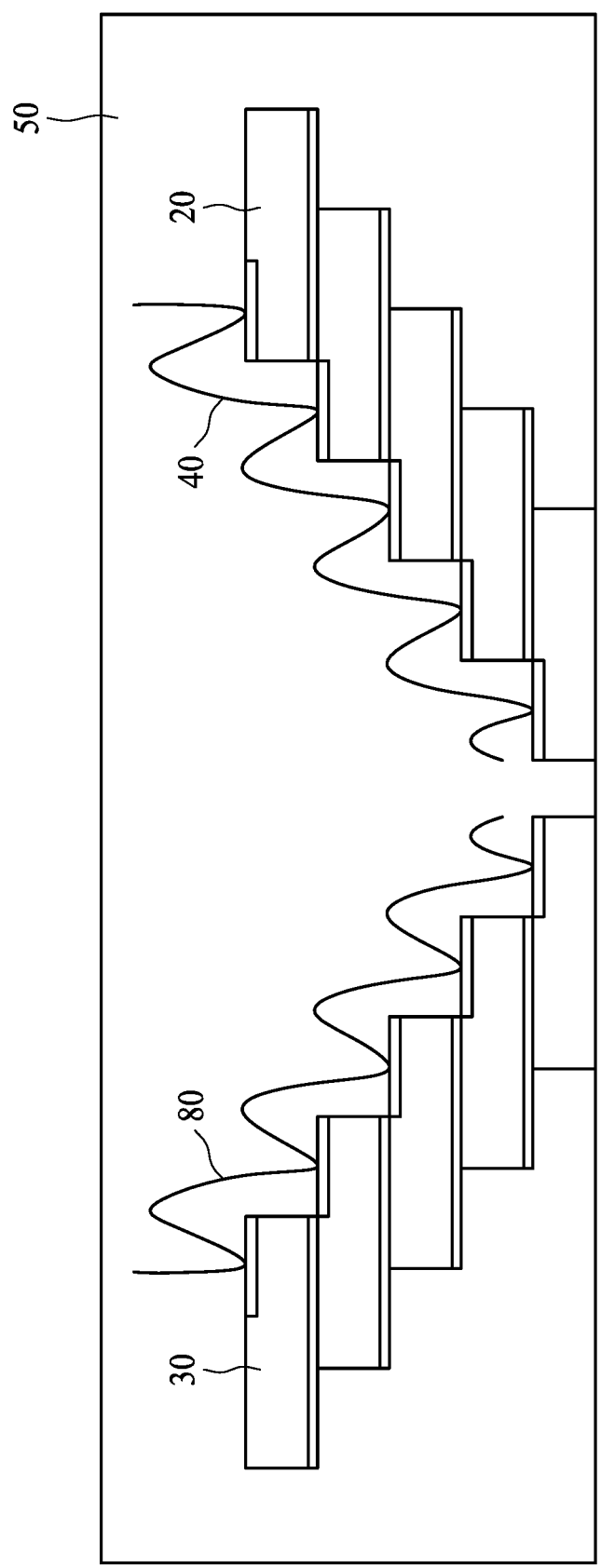
Figure 6G:
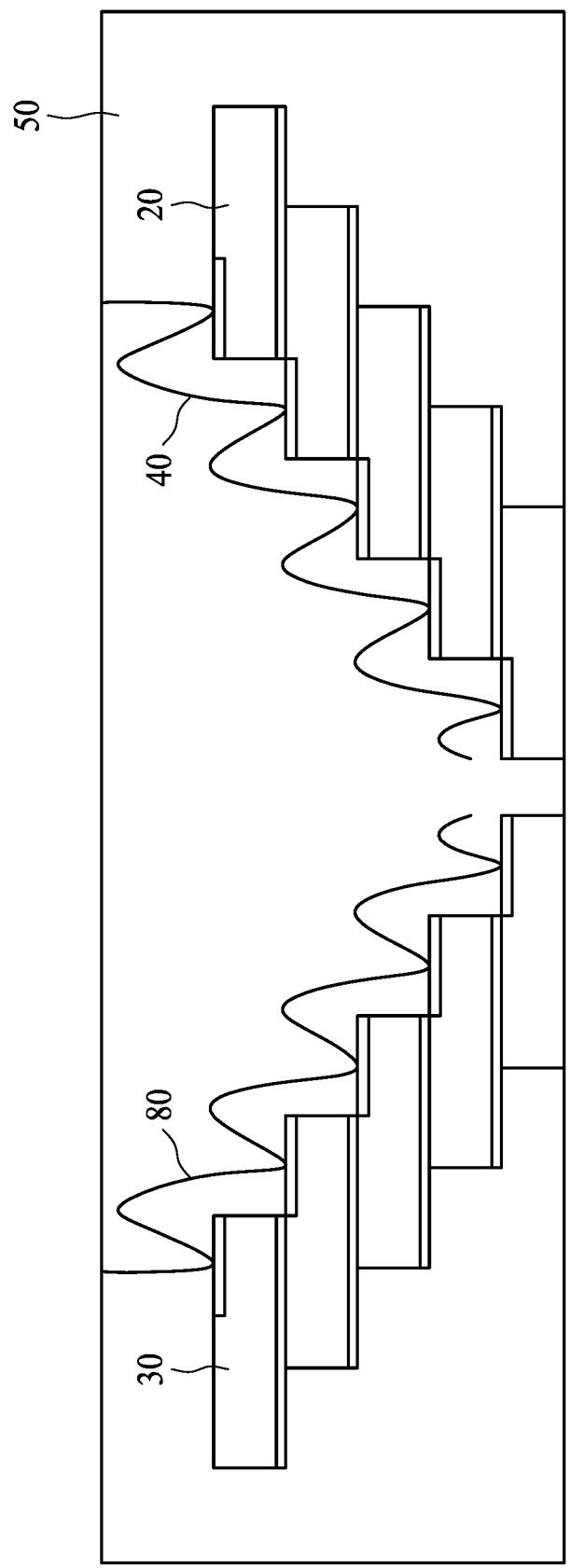

Referring to FIG. 6E, an insulating layer (or insulating material) 50 is formed on the release film RF. The insulating layer 50 encapsulates the set of stacked components 20, the set of stacked components 30, the conductive wire 40 and the conductive wire 80. The insulating layer 50 may be formed by a molding operation. Referring to FIG. 6F, the carrier CR and the release film RF are removed. An ultraviolet operation may be used to remove the carrier CR and the release film RF. The set of stacked components 20 and the set of stacked components 30 are exposed. Referring to FIG. 6G, a grinding operation is performed to remove a portion of the insulating layer 50, a portion of the conductive wire 40 and a portion of the conductive wire 80 to expose the conductive wire 40 and the conductive wire 80.

Figure 6H:
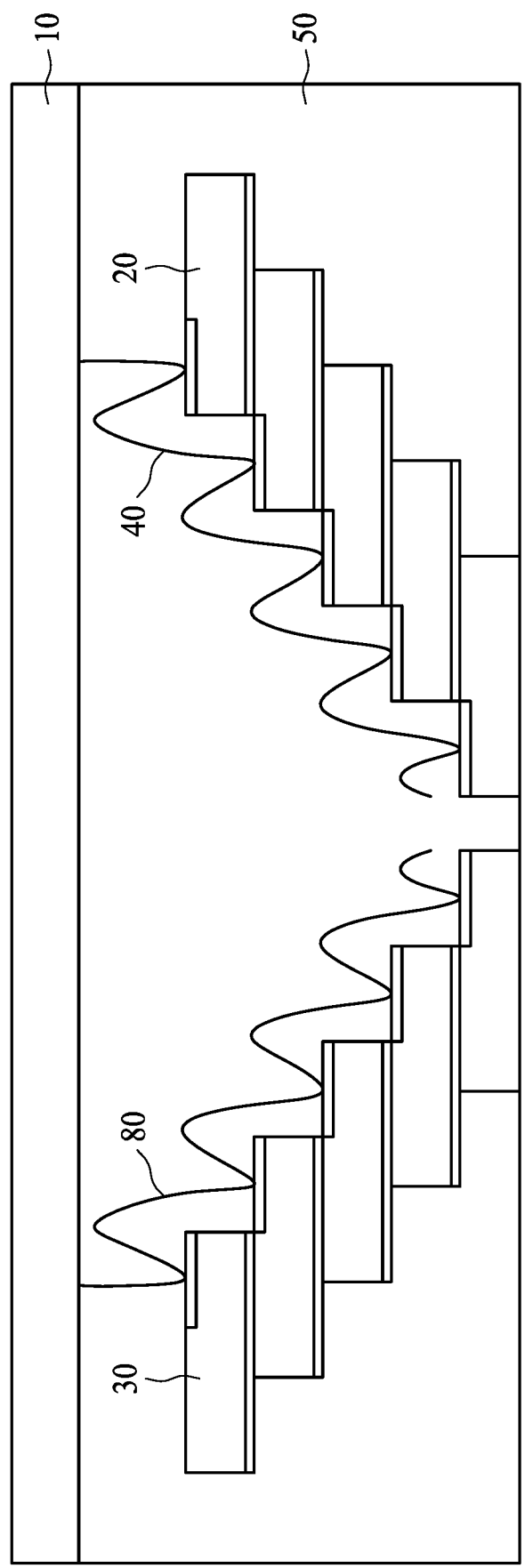

Referring to FIG. 6H, a circuit layer (or redistribution layer) 10 is formed on the insulating layer 50. The circuit layer 10 is electrically connected to the conductive wire 40 and the conductive wire 80. Referring to FIG. 6I, connection elements 90 are disposed on the circuit layer 10. The connection elements 90 are electrically connected to conductive lines, traces, vias or pillars in the circuit layer 10. The connection elements 90 may be disposed by a ball mount operation which may include a reflow operation. The semiconductor package device 6i is formed. The semiconductor package device 6i may be similar to or the same as the semiconductor package device 2a of FIG. 2A.

FIG. 7A, FIG. 7B, FIG. 7C, FIG. 7D, FIG. 7E, FIG. 7F, FIG. 7G, FIG. 7H and FIG. 7I are cross-sectional views of a semiconductor package device 7i fabricated at various stages, in accordance with some embodiments of the present disclosure. Various figures have been simplified for a better understanding of the aspects of the present disclosure.

Figure 7A:
Figure 7B:
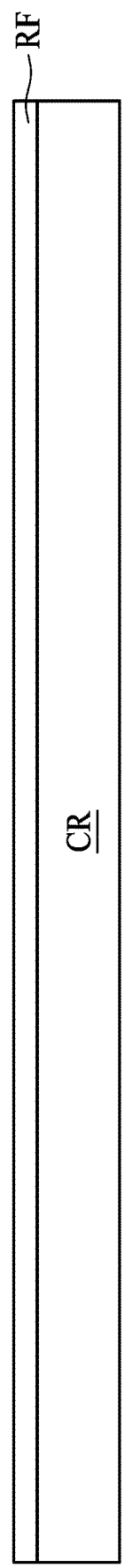
Figure 7C:
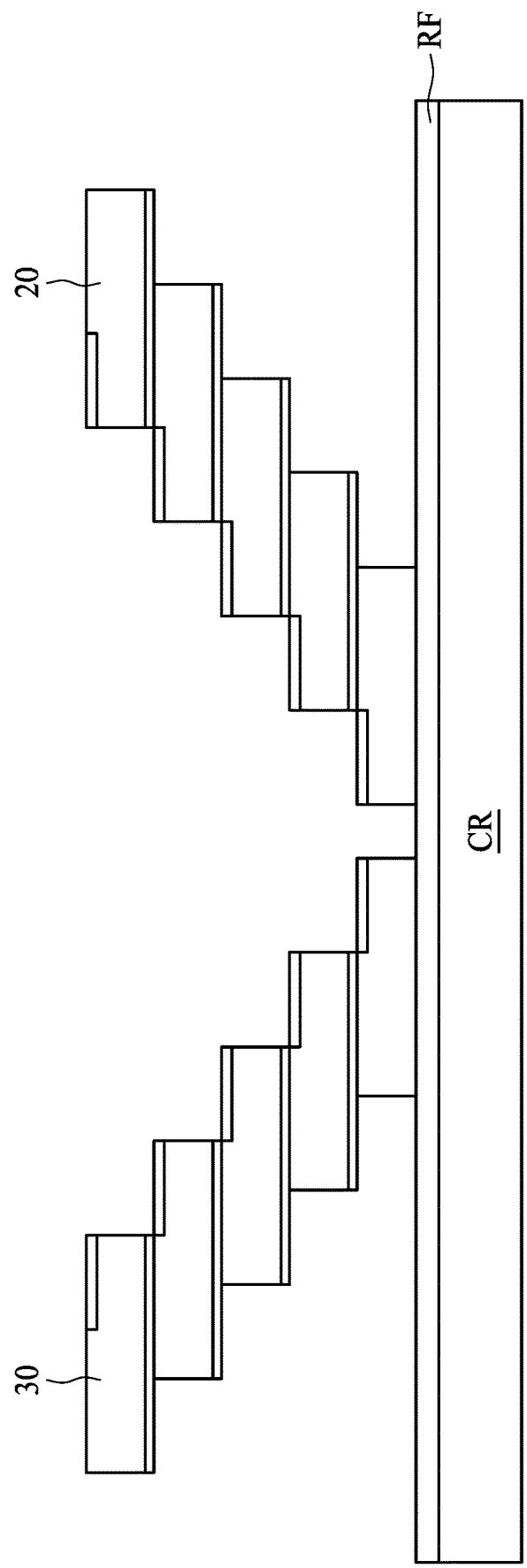
Figure 7D:
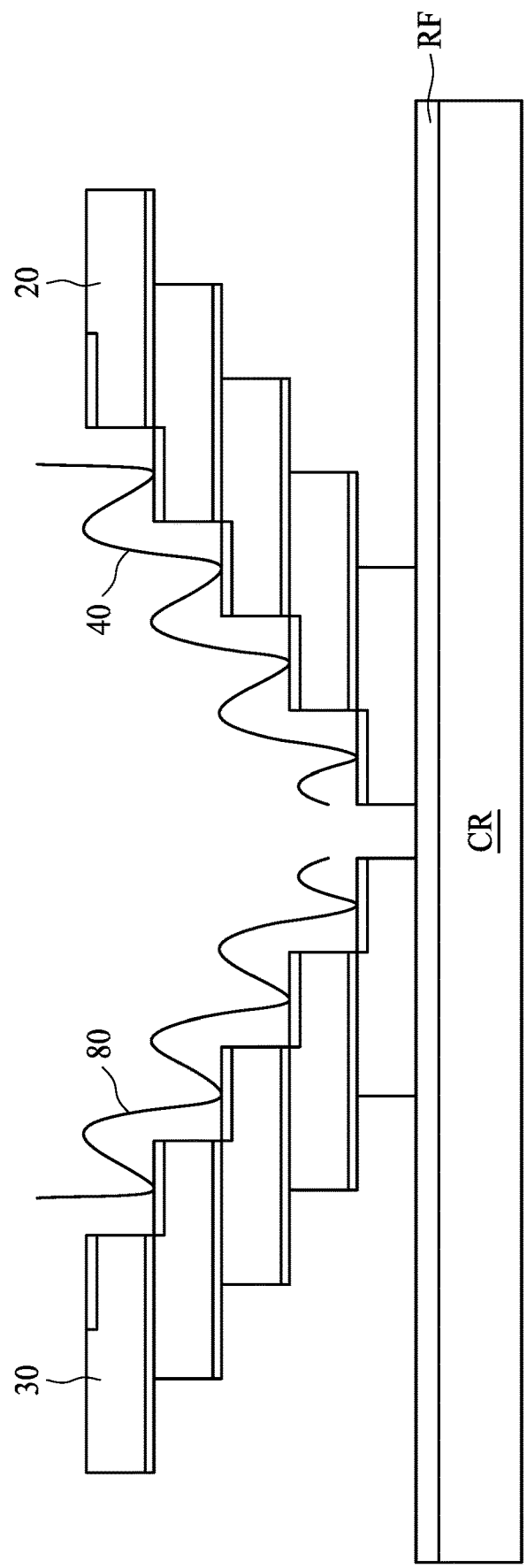

Referring to FIG. 7A, a carrier CR is provided. The carrier CR may include glass or other materials. Referring to FIG. 7B, a release film or a release layer RF is provided on the carrier CR. The release film RF may be coated or laminated on the carrier CR. Referring to FIG. 7C, sets of stacked components 20 and 30 are disposed on the release film RF, wherein die bonding operations may be performed. Referring to FIG. 7D, a conductive wire 40 is bonded on the set of stacked components 20. A conductive wire 80 is bonded on the set of stacked components 30. A vertical bonding operation may be utilized in bonding the conductive wires 40 and 80.

Figure 7E:
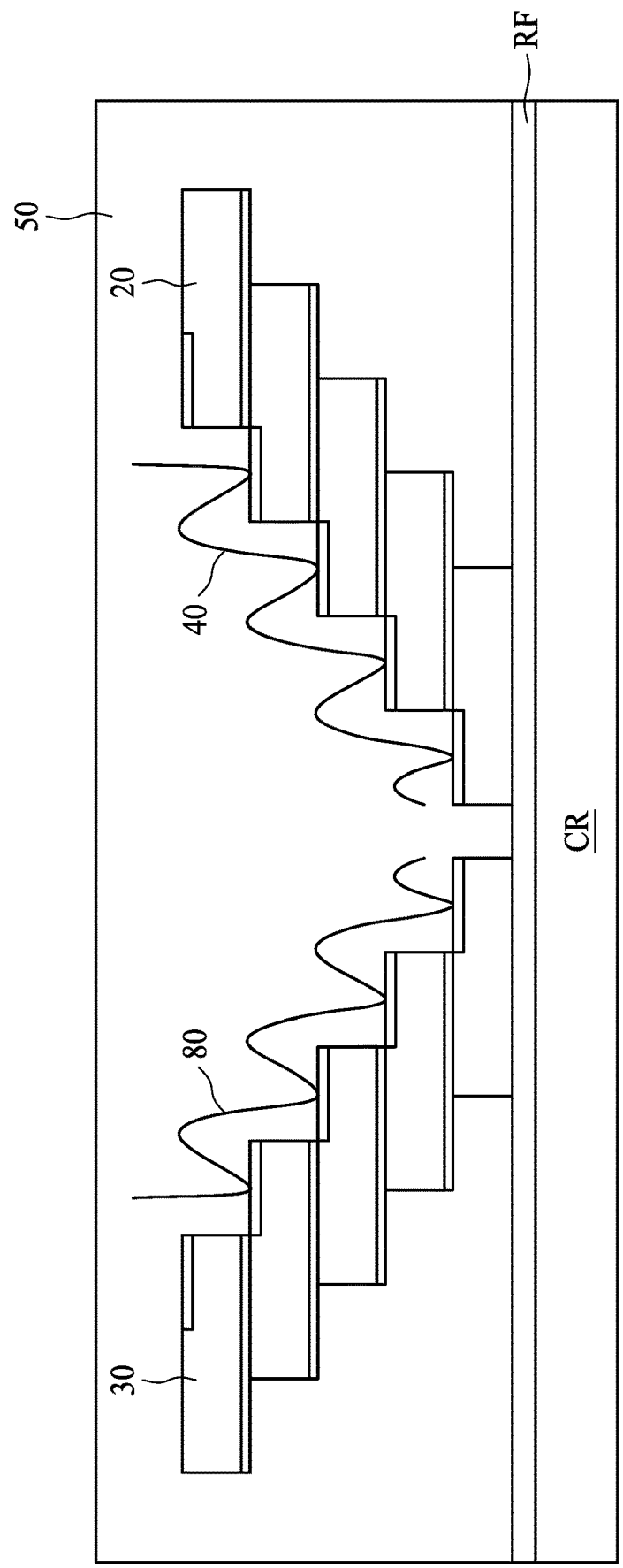
Figure 7F:
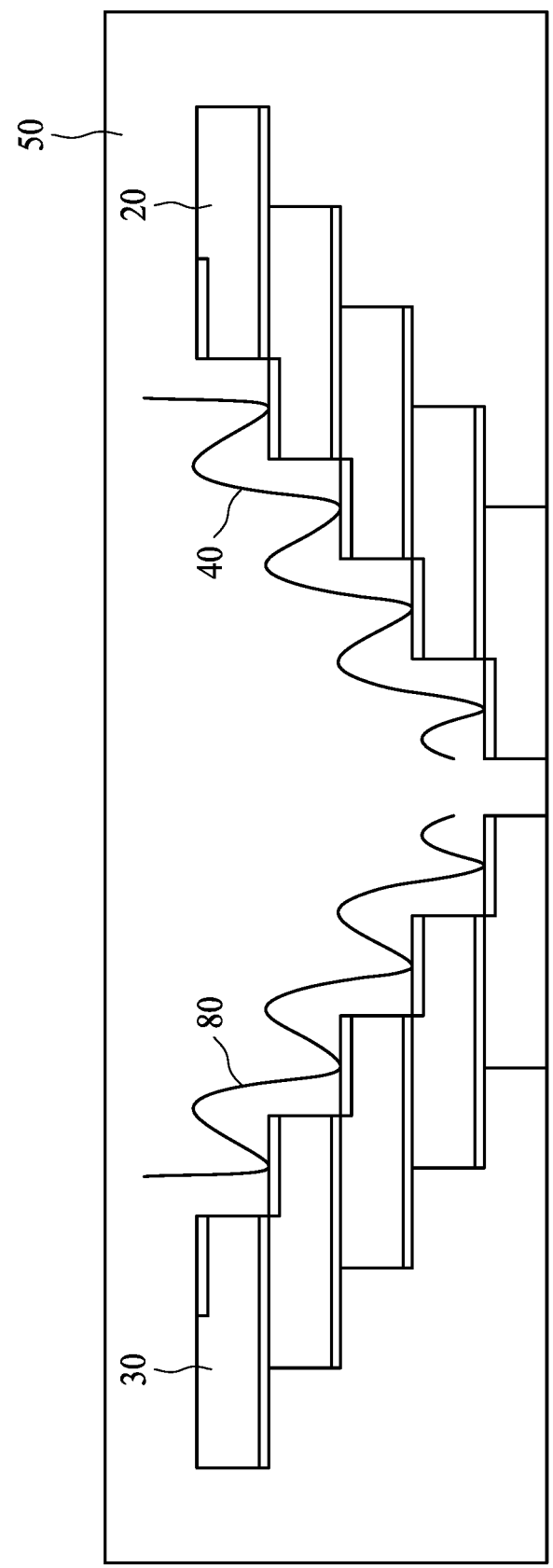

Referring to FIG. 7E, an insulating layer (or insulating material) 50 is formed on the release film RF. The insulating layer 50 encapsulates the set of stacked components 20, the set of stacked components 30, the conductive wire 40 and the conductive wire 80. The insulating layer 50 may be formed by a molding operation. Referring to FIG. 7F, the carrier CR and the release film RF are removed. An ultraviolet operation may be used to remove the carrier CR and the release film RF. The set of stacked components 20 and the set of stacked components 30 are exposed.

Figure 7G:
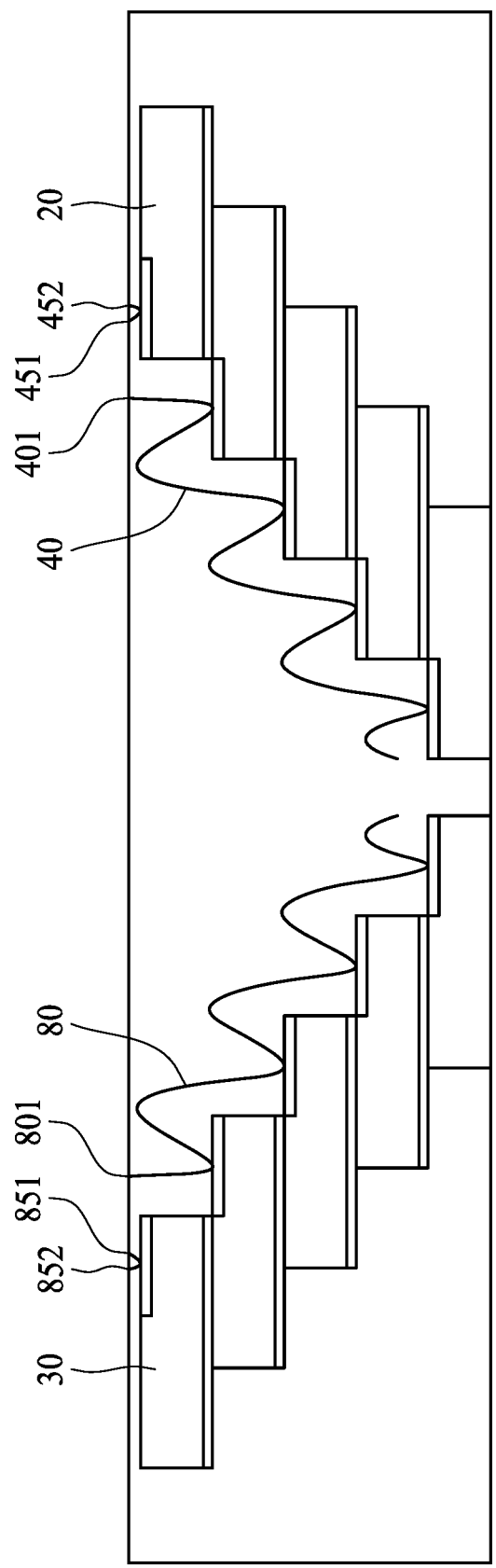

Referring to FIG. 7G, a grinding operation is performed to remove a portion of the insulating layer 50, a portion of the conductive wire 40 and a portion of the conductive wire 80 to expose terminals 401, 451 and 452 (which come from the conductive wire 40) and terminals 801, 851 and 852 (which come from the conductive wire 80).

Figure 7H:
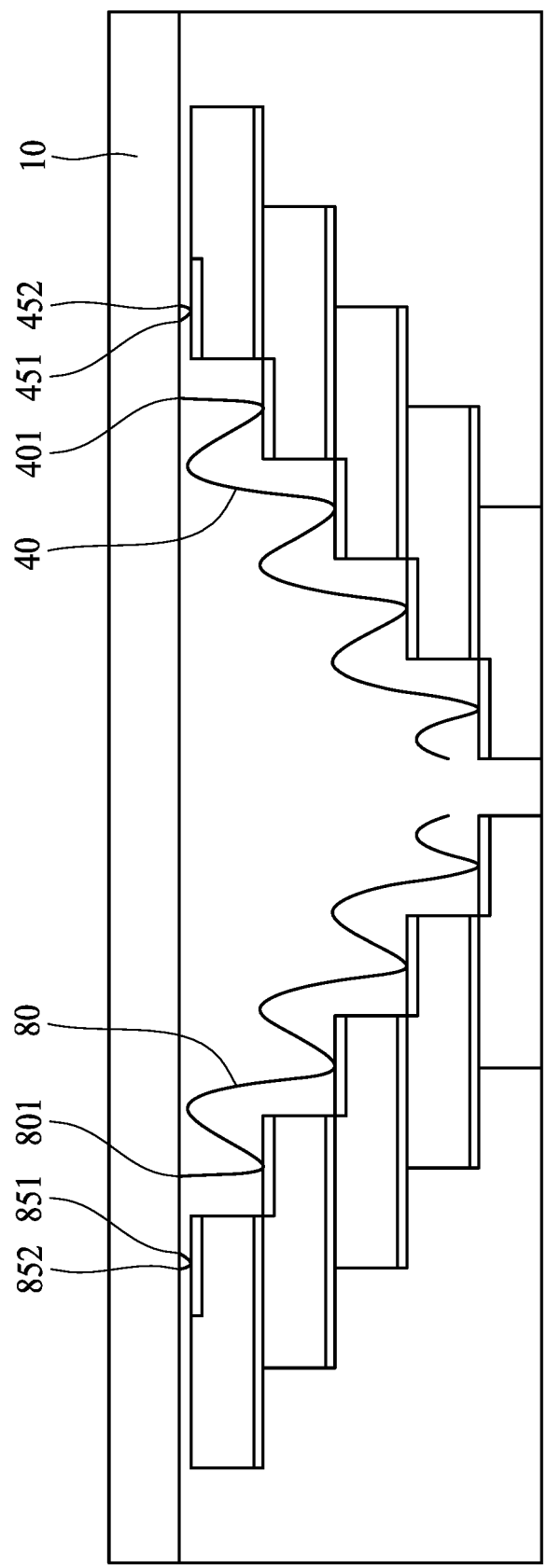

Referring to FIG. 7H, a circuit layer (or redistribution layer) 10 is formed on the insulating layer 50. The circuit layer 10 is electrically connected to the terminals 401, 451 and 452 of the conductive wire 40 and the terminals 801, 851 and 852 of the conductive wire 80. Referring to FIG. 7I, connection elements 90 are disposed on the circuit layer 10. The connection elements 90 are electrically connected to conductive lines, traces, vias or pillars in the circuit layer 10. The connection elements 90 may be disposed by a ball mount operation which may include a reflow operation. The semiconductor package device 7i is formed. The semiconductor package device 7i may be similar to or the same as the semiconductor package device 3a of FIG. 3A.

FIG. 8A, FIG. 8B, FIG. 8C, FIG. 8D, FIG. 8E, FIG. 8F, FIG. 8G, FIG. 8H, FIG. 8I, FIG. 8J and FIG. 8K are cross-sectional views of a semiconductor package device 8k fabricated at various stages, in accordance with some embodiments of the present disclosure. Various figures have been simplified for a better understanding of the aspects of the present disclosure.

Figure 8A:
FIG. 8A, FIG. 8B, FIG. 8C, FIG. 8D, FIG. 8E, FIG. 8F, FIG. 8G, FIG. 8H, FIG. 8I, FIG. 8J and FIG. 8K are cross-sectional views of a semiconductor package device fabricated at various stages, in accordance with some embodiments of the present disclosure.
Figure 8B:
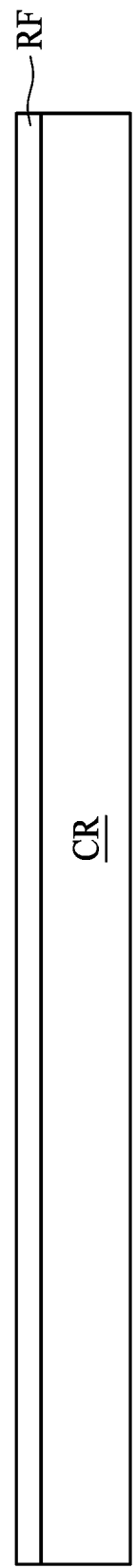
Figure 8C:
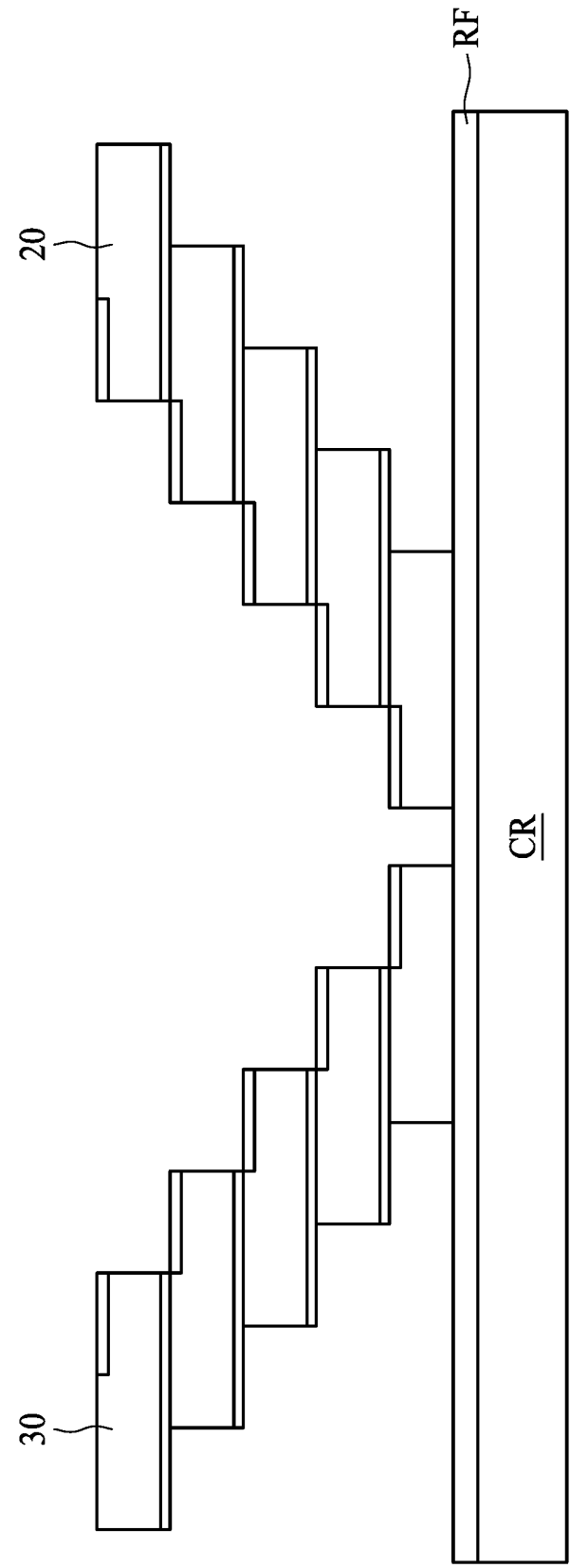
Figure 8D:
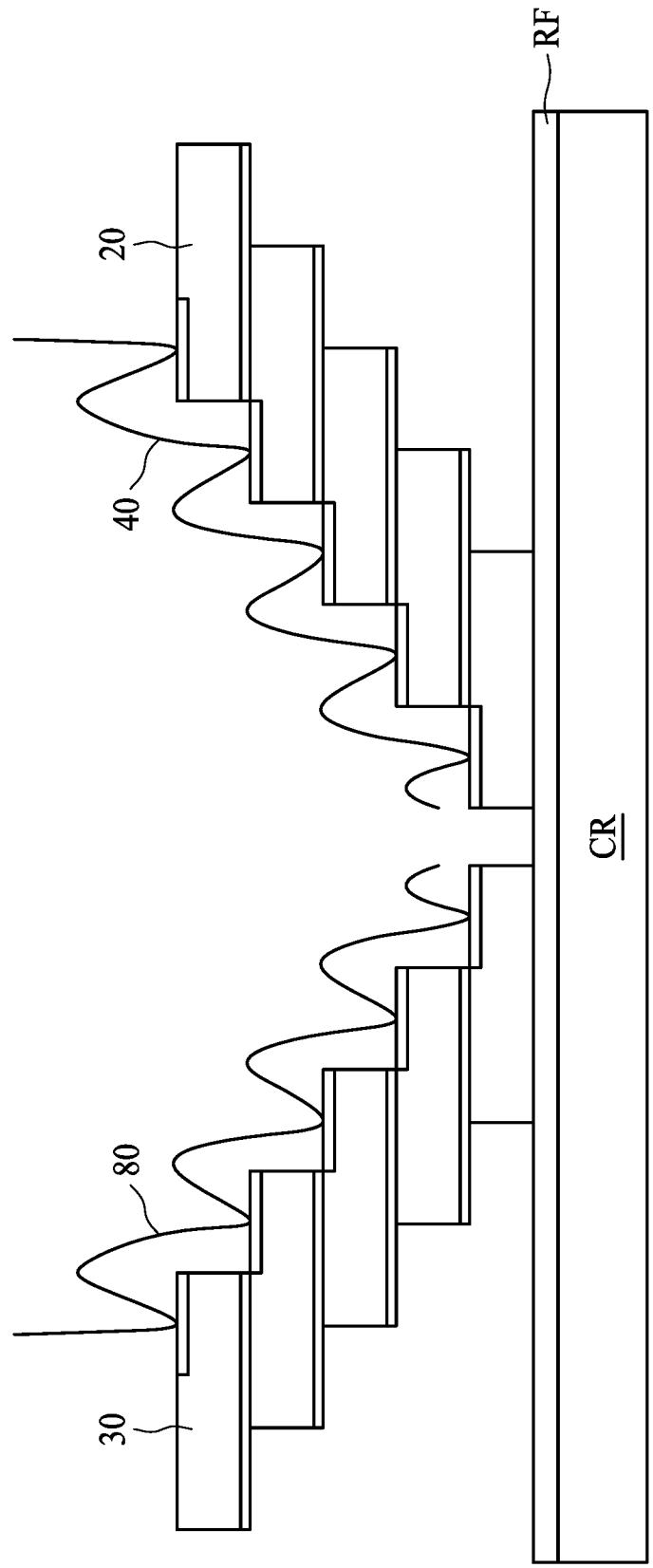

Referring to FIG. 8A, a carrier CR is provided. The carrier CR may include glass or other materials. Referring to FIG. 8B, a release film or a release layer RF is provided on the carrier CR. The release film RF may be coated or laminated on the carrier CR. Referring to FIG. 8C, sets of stacked components 20 and 30 are disposed on the release film RF, wherein die bonding operations may be performed. Referring to FIG. 8D, a conductive wire 40 is bonded on the set of stacked components 20. A conductive wire 80 is bonded on the set of stacked components 30. A vertical bonding operation may be utilized in bonding the conductive wires 40 and 80.

Figure 8E:
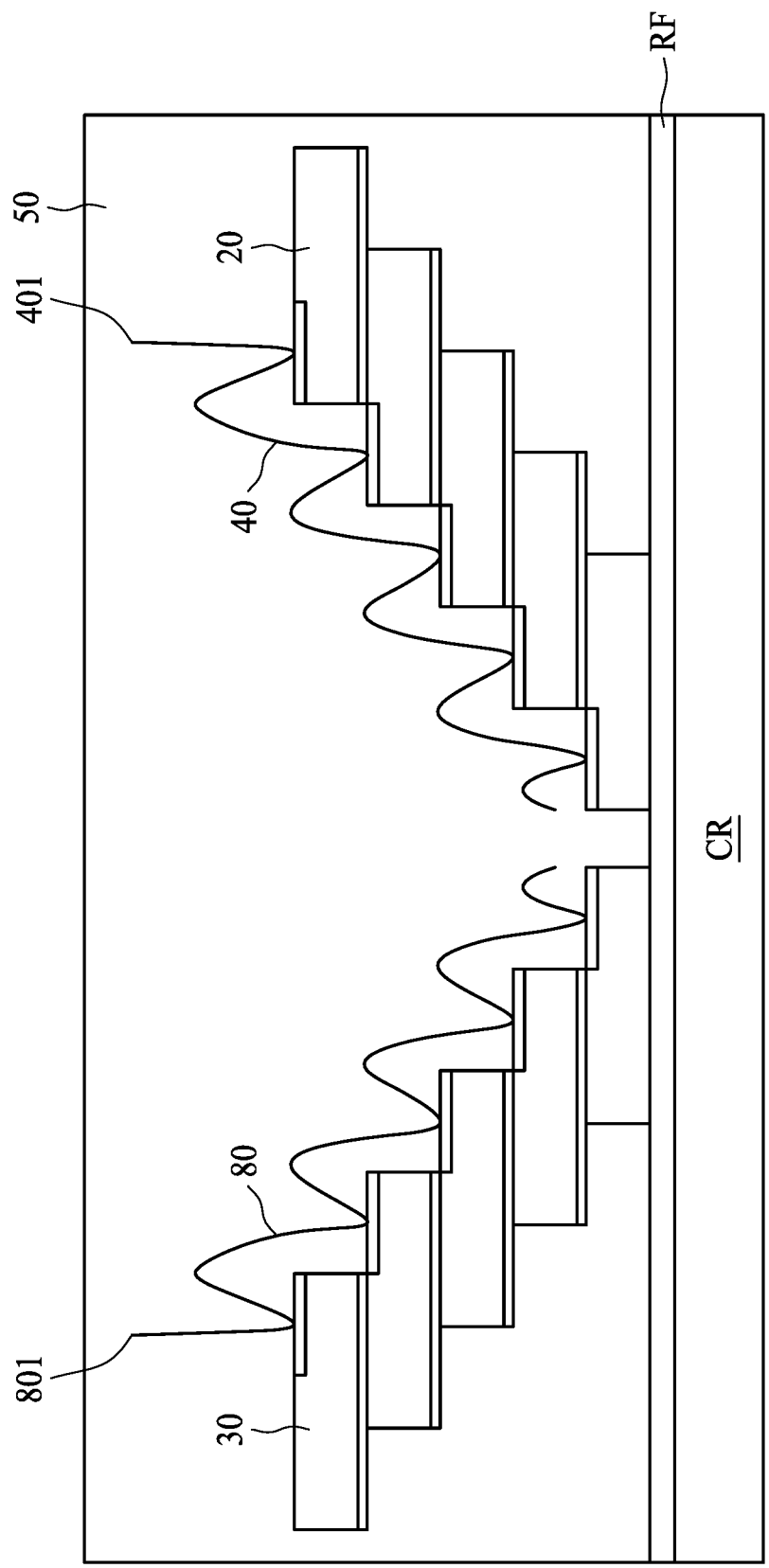

Referring to FIG. 8E, an insulating layer (or insulating material) 50 is formed on the release film RF. The insulating layer 50 encapsulates the set of stacked components 20, the set of stacked components 30, the conductive wire 40 and the conductive wire 80. The insulating layer 50 may be formed by a molding operation. In the embodiment shown in FIG. 8E, the insulating layer 50 fully encapsulates the conductive wire 40 and the conductive wire 80. In other embodiments, the insulating layer 50 may not fully encapsulate the conductive wire 40 and the conductive wire 80. For example, a terminal or an end 401 of the conductive wire 40 and a terminal or an end 801 of the conductive wire 80 may be exposed from the insulating layer 50.

Figure 8F:
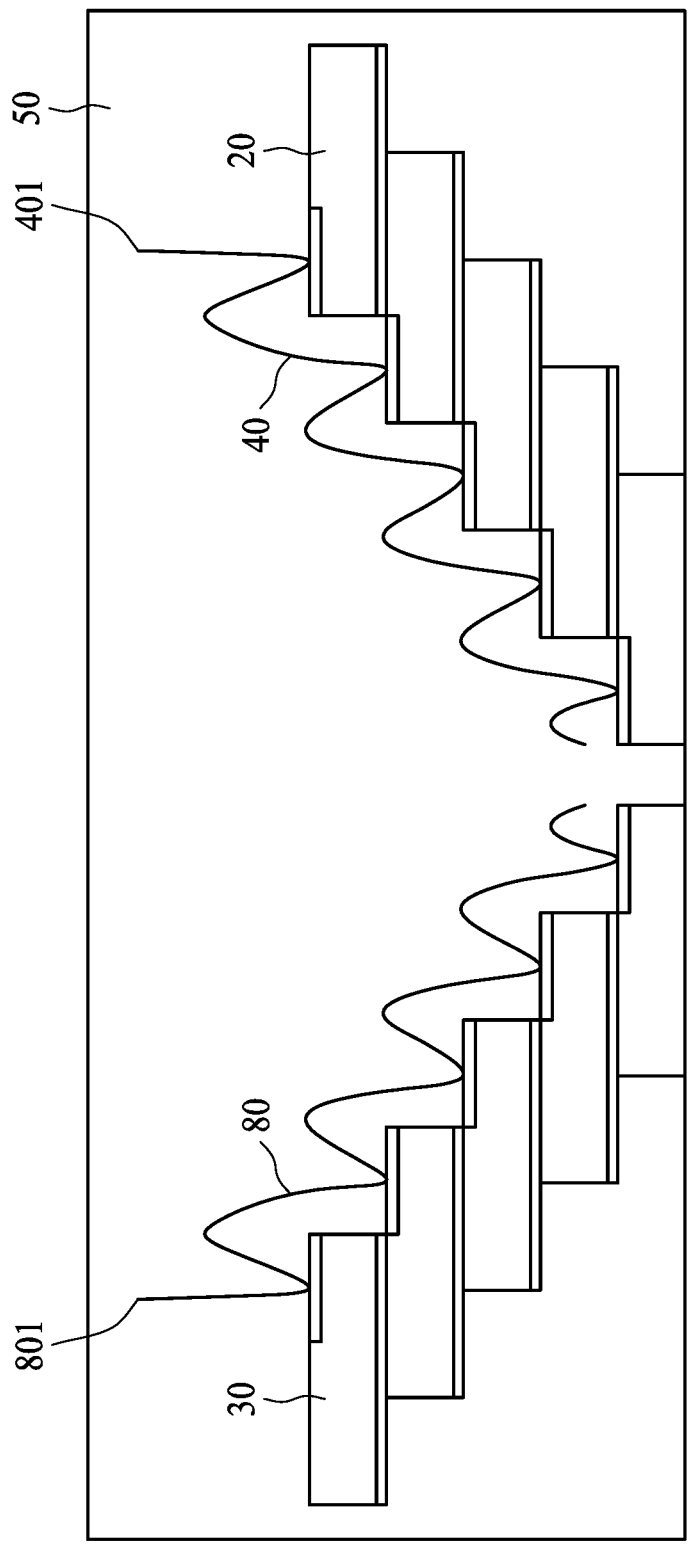
Figure 8G:
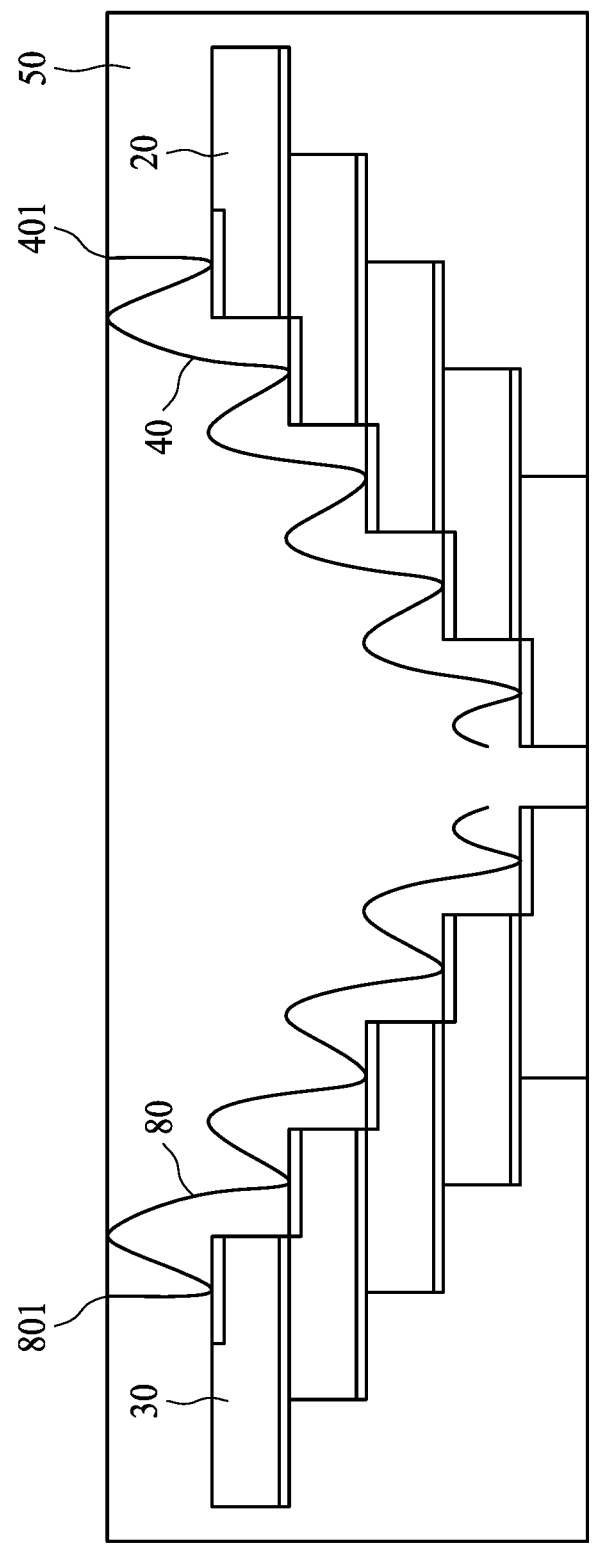

Referring to FIG. 8F, the carrier CR and the release film RF are removed. An ultraviolet operation may be used to remove the carrier CR and the release film RF. The set of stacked components 20 and the set of stacked components 30 are exposed. Referring to FIG. 8G, a grinding operation is performed to remove a portion of the insulating layer 50, a portion of the conductive wire 40 and a portion of the conductive wire 80 to expose the conductive wire 40 and the conductive wire 80. In some embodiments, the grinding operation in FIG. 8G may be omitted.

Figure 8H:
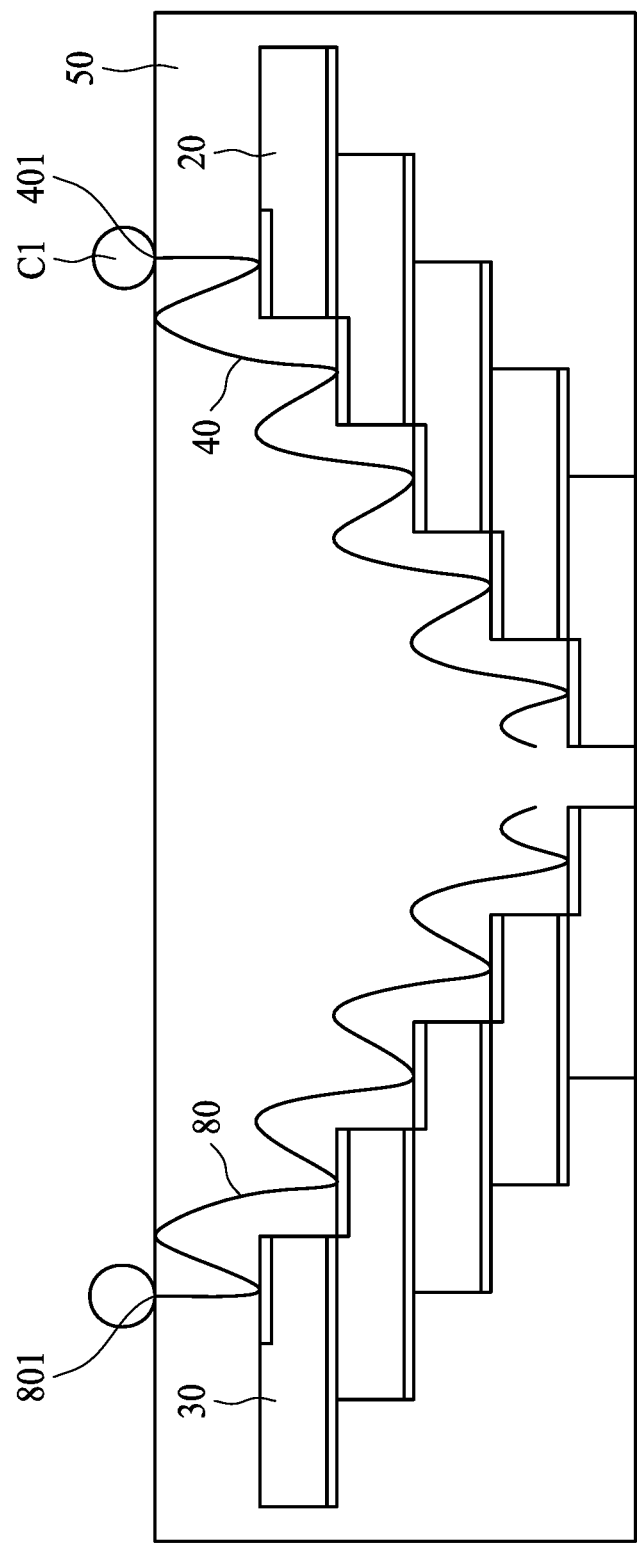
Figure 8I:
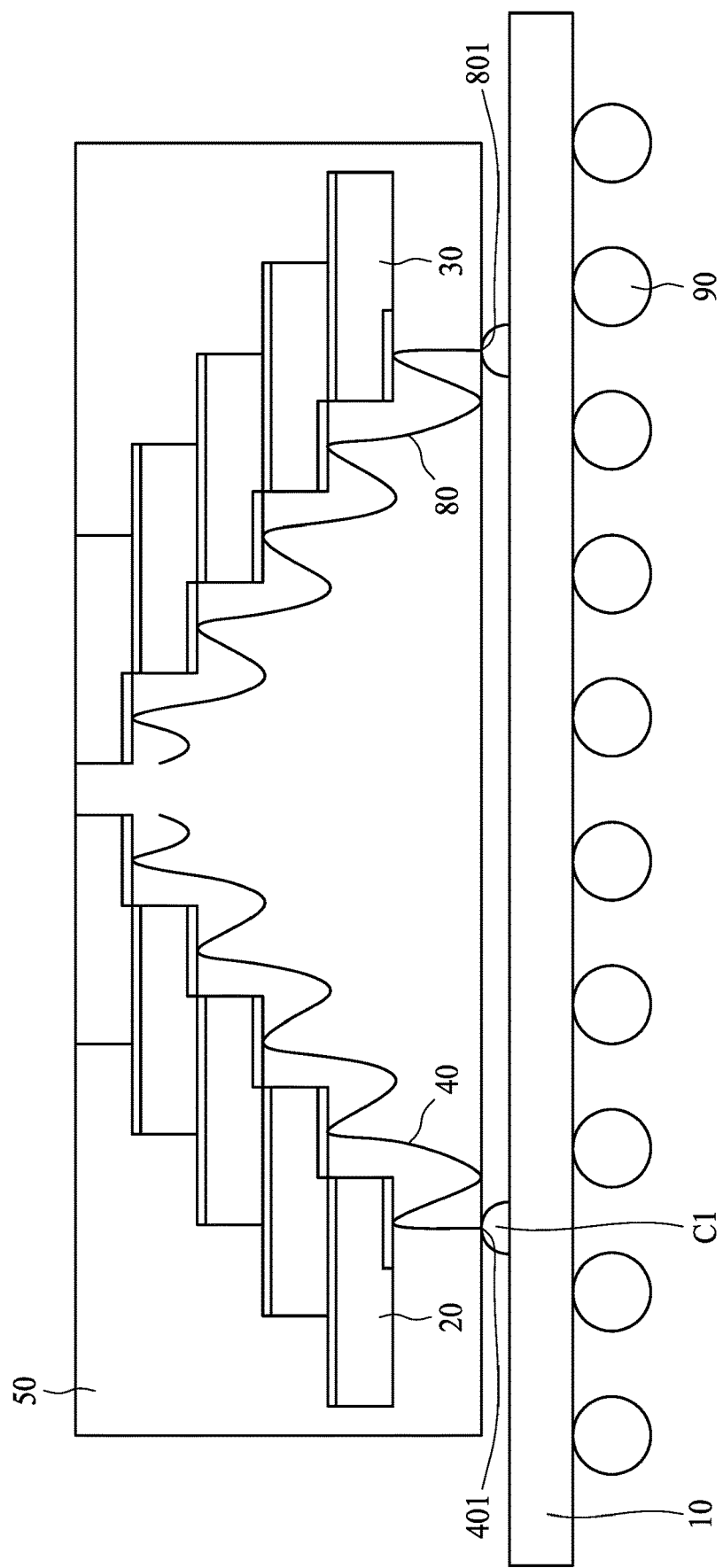
Figure 8J:
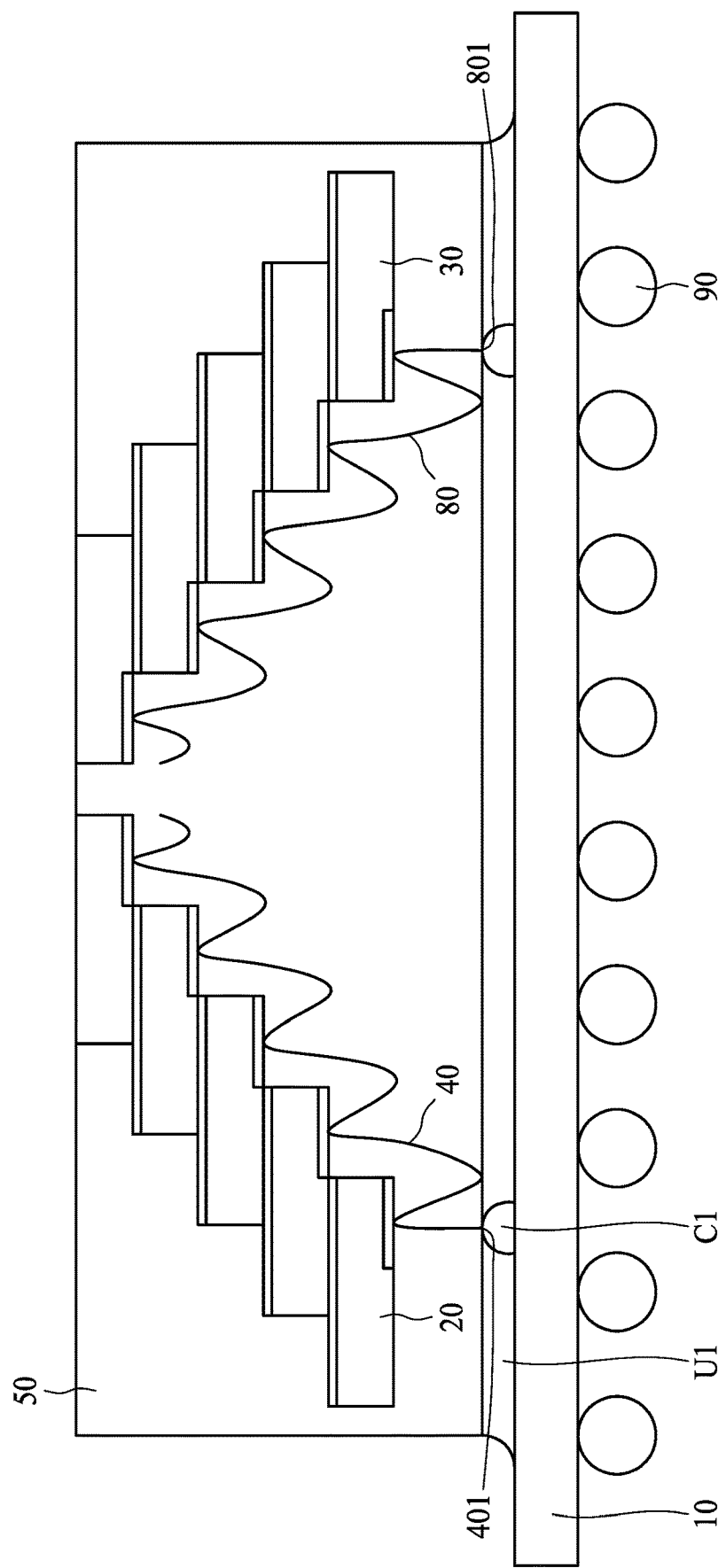

Referring to FIG. 8H, electrical contacts (or conductive bumps or pillars) C1 are disposed on the exposed portion of the conductive wire 40 and the exposed portion of the conductive wire 80. Referring to FIG. 8I, the structure in FIG. 8H is bonded on a circuit layer 10 through the electrical contacts C1. A flip-chip bonding may be performed. Referring to FIG. 8J, an underfill U1 is formed between the insulating layer 50 and the circuit layer 10. The underfill U1 surrounds or encapsulates the electrical contacts C1. The underfill U1 may be formed by a dispensing operation.

Figure 8K:
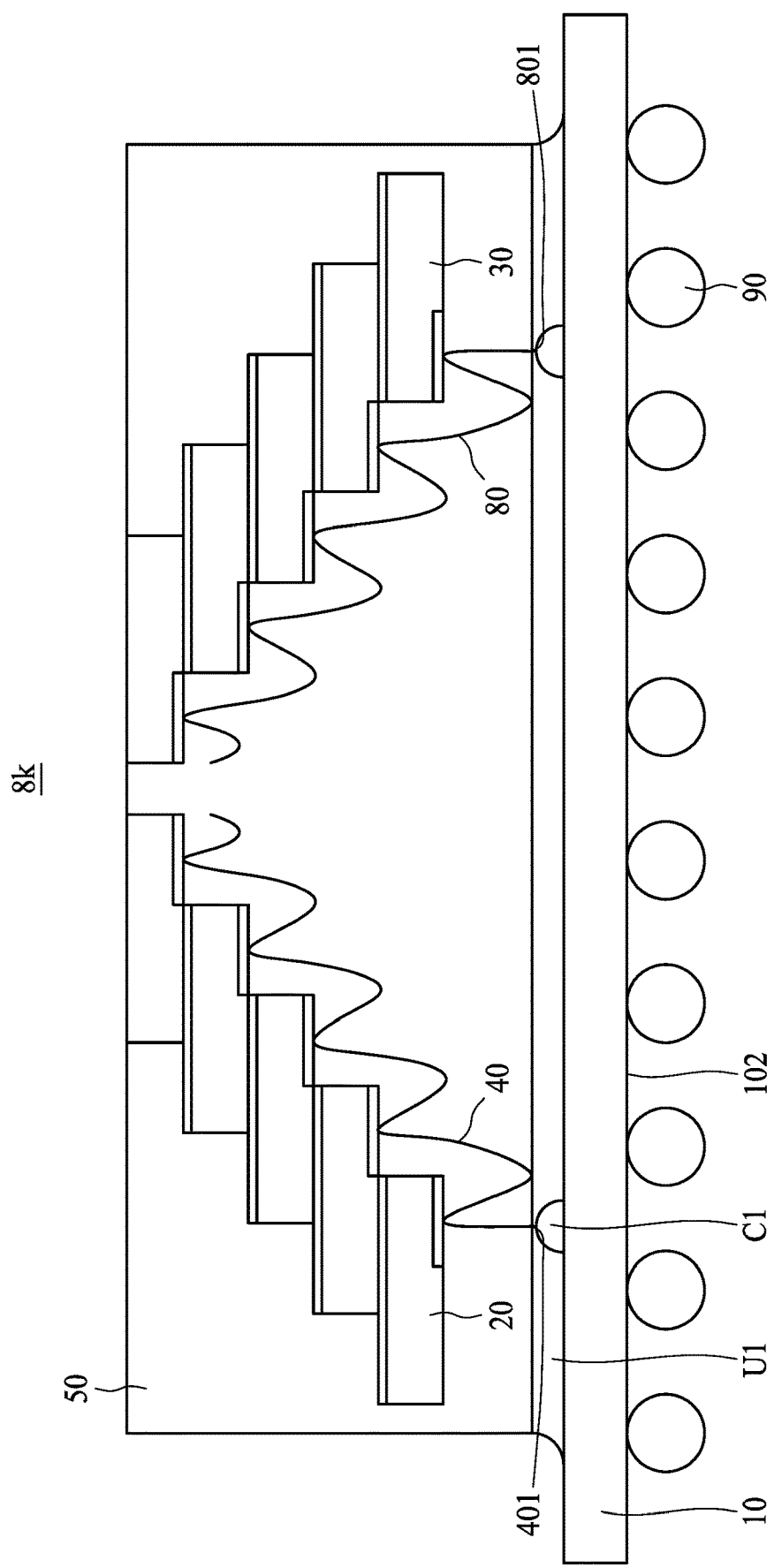

Referring to FIG. 8K, connection elements 90 are disposed on a surface 102 of the circuit layer 10. The connection elements 90 are electrically connected to conductive lines, traces, vias or pillars in the circuit layer 10. The connection elements 90 may be disposed by a ball mount operation which may include a reflow operation. The semiconductor package device 8k is formed. The semiconductor package device 8k may be similar to or the same as the semiconductor package device 4a of FIG. 4.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be planar or substantially planar if a difference between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a circuit layer;
   a first set of stacked components disposed on the circuit layer;
   a first conductive wire electrically connecting the first set of stacked components;
   a space defined between the first set of stacked components and the circuit layer, the space accommodating the first conductive wire;
   an electronic component disposed in the space; and
   a first insulating layer encapsulating the first set of stacked components, wherein the first insulating layer defines a recess in the space to accommodate the electronic component,
   wherein the electronic component has a backside in contact with the first insulating layer.

2. The semiconductor package device of claim 1, further comprising a second insulating layer disposed in the recess to surround the electronic component, wherein a Young's modulus of the second insulating layer is greater than a Young's modulus of the first insulating layer.

3. The semiconductor package device of claim 1, further comprising a second insulating layer disposed in the recess to surround the electronic component, wherein a coefficient of expansion (CTE) of the second insulating layer is greater than a CTE of the first insulating layer.

4. The semiconductor package device of claim 1, wherein the first set of stacked components is spaced apart from the circuit layer by the first insulating layer.

5. The semiconductor package device of claim 4, wherein the first conductive wire comprises a first portion electrically connecting to at least two components of the first set of stacked components and a second portion electrically connecting the first set of stacked components to the circuit layer, and
   wherein the first set of stacked components comprises a plurality of chips, and one of the chips comprises a pad contacting the first portion of the first conductive wire and the second portion of the first conductive wire.

6. The semiconductor package device of claim 1, wherein the first conductive wire comprises at least two terminals exposed from the first insulating layer and electrically connected to the circuit layer, wherein the at least two terminals are electrically connected to each other.

7. The semiconductor package device of claim 6, wherein the circuit layer comprises a pad in contact with the at least two terminals of the first conductive wire.

8. The semiconductor package device of claim 1, further comprising:
   an electrical contact connecting a terminal of the first conductive wire to the circuit layer, wherein the terminal of the first conductive wire is exposed from the first insulating layer; and
   an underfill disposed between the first insulating layer and the circuit layer, wherein the underfill surrounds the electrical contact.

9. The semiconductor package device of claim 1, wherein the electronic component includes a controller.

10. The semiconductor package device of claim 1, comprising:
    a second set of stacked components disposed on the circuit layer; and
    a second conductive wire electrically connecting the second set of stacked components;
    wherein the first set of stacked components, the second set of stacked components and the circuit layer define the space; and
    wherein the space accommodates the second conductive wire.

11. The semiconductor package device of claim 1, wherein the first set of stacked components comprises a first chip, and a second chip disposed on the first chip;
    wherein the first conductive wire electrically connects to the first chip and a second conductive wire electrically connects to the second chip; and
    wherein the first conductive wire comprises a terminal exposed from the first insulating layer and electrically connected to the circuit layer, and the second conductive wire comprises a first terminal exposed from the first insulating layer and electrically connected to the circuit layer.

12. The semiconductor package device of claim 11, wherein
    the circuit layer comprises a first pad and a second pad physically spaced apart from the first pad;
    the first pad is electrically connected to the second pad;
    the first pad is in contact with the terminal of the first conductive wire; and
    the second pad is in contact with the first terminal of the second conductive wire.

13. The semiconductor package device of claim 1, wherein the first set of stacked components comprises a plurality of components stacked in a direction in the shape of a ladder.

14. The semiconductor package device of claim 1, wherein the first conductive wire includes a portion, wherein the portion is substantially perpendicular to a surface of the first set of stacked components or to a surface of the circuit layer.

15. The semiconductor package device of claim 1, wherein a surface of one component of the set of stacked components is coplanar with a surface of the first insulating layer.

16. The semiconductor package device of claim 1, wherein the recess is recessed from a surface of the first insulating layer facing toward the circuit layer.

17. The semiconductor package device of claim 10, wherein the electronic component is surrounded by the first conductive wire, the second conductive wire and the circuit layer.

18. The semiconductor package device of claim 1, wherein the electronic component is electrically connected to the first set of stacked components through a redistribution layer within the circuit layer and the first conductive wire.

19. The semiconductor package device of claim 1, further comprising a second insulating layer disposed in the recess to surround the electronic component, wherein the first insulating layer has a first plurality of fillers and the second insulating layer has a second plurality of fillers, wherein an interface is defined between the first insulating layer and the second insulating layer, and wherein the first plurality of fillers and the second plurality of fillers are separated clearly by the interface.

20. The semiconductor package device of claim 1, further comprising a second insulating layer disposed in the recess to surround the electronic component, wherein the first set of stacked components and the second insulating layer are spaced apart by the first insulating layer.

21. The semiconductor package device of claim 1, wherein the first conductive wire is disposed between the first set of stacked components and the electronic component.

22. The semiconductor package device of claim 10, wherein the first set of stacked components is disposed next to the second set of stacked components in a direction parallel with a surface of the circuit layer.

* * * * *